US010651165B2

(12) United States Patent
Laven et al.

(10) Patent No.: US 10,651,165 B2
(45) Date of Patent: May 12, 2020

(54) SEMICONDUCTOR DEVICE HAVING OVERLOAD CURRENT CARRYING CAPABILITY

(71) Applicant: Infineon Technologies AG, Neubiberg (DE)

(72) Inventors: Johannes Georg Laven, Taufkirchen (DE); Roman Baburske, Otterfing (DE); Thomas Basler, Riemerling (DE); Philip Christoph Brandt, Oberhaching (DE); Maria Cotorogea, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 932 days.

(21) Appl. No.: 14/971,677

(22) Filed: Dec. 16, 2015

(65) Prior Publication Data

US 2016/0204097 A1    Jul. 14, 2016

(30) Foreign Application Priority Data

Dec. 17, 2014    (DE) .................. 10 2014 226 161

(51) Int. Cl.
*H01L 27/02*    (2006.01)
*H01L 29/06*    (2006.01)
(Continued)

(52) U.S. Cl.
CPC ...... *H01L 27/0266* (2013.01); *H01L 27/0255* (2013.01); *H01L 27/0262* (2013.01);
(Continued)

(58) Field of Classification Search
None
See application file for complete search history.

(56) References Cited

U.S. PATENT DOCUMENTS

2004/0084724 A1*   5/2004   Kapels ............. H01L 21/28512
                                                                                                                         257/330
2005/0032287 A1    2/2005   Nakazawa et al.
(Continued)

FOREIGN PATENT DOCUMENTS

DE    112011105785 T5    8/2014
JP    2005057049 A    3/2005
(Continued)

*Primary Examiner* — Walter H Swanson
*Assistant Examiner* — Kien C Ly
(74) *Attorney, Agent, or Firm* — Murphy, Bilak & Homiller, PLLC

(57) ABSTRACT

A semiconductor device includes a semiconductor region having charge carriers of a first conductivity type, a transistor cell in the semiconductor region, and a semiconductor channel region in the transistor cell and having a first doping concentration of charge carriers of a second conductivity type. A semiconductor auxiliary region in the semiconductor region has a second doping concentration of charge carriers of the second conductivity type, which is at least 30% higher than the first doping concentration. A pn-junction between the semiconductor auxiliary region and the semiconductor region is positioned as deep or deeper in the semiconductor region as a pn-junction between the semiconductor channel region and the semiconductor region. The semiconductor auxiliary region is positioned closer to the semiconductor channel region than any other semiconductor region having charge carriers of the second conductivity type and that forms a further pn-junction with the semiconductor region.

11 Claims, 9 Drawing Sheets

(51) Int. Cl.

| | | |
|---|---|---|
| *H01L 29/10* | (2006.01) | |
| *H01L 29/08* | (2006.01) | |
| *H01L 29/423* | (2006.01) | |
| *H01L 29/739* | (2006.01) | |
| *H01L 29/861* | (2006.01) | |
| *H01L 29/40* | (2006.01) | |
| *H03K 17/082* | (2006.01) | |

(52) U.S. Cl.
CPC ...... *H01L 29/0684* (2013.01); *H01L 29/0696* (2013.01); *H01L 29/0865* (2013.01); *H01L 29/1033* (2013.01); *H01L 29/1095* (2013.01); *H01L 29/407* (2013.01); *H01L 29/4236* (2013.01); *H01L 29/7397* (2013.01); *H01L 29/861* (2013.01); *H01L 29/8613* (2013.01); *H03K 17/0828* (2013.01)

(56) References Cited

U.S. PATENT DOCUMENTS

| | | |
|---|---|---|
| 2012/0261714 A1 | 10/2012 | Taketani et al. |
| 2013/0092978 A1 | 4/2013 | Sugawara et al. |
| 2013/0105933 A1 | 5/2013 | Sato et al. |
| 2014/0246682 A1* | 9/2014 | Uchida ............... H01L 27/0629 257/77 |
| 2017/0098700 A1* | 4/2017 | Yamashita ............ H01L 29/407 |

FOREIGN PATENT DOCUMENTS

| | | |
|---|---|---|
| JP | 2007529115 A | 10/2007 |
| JP | 2009170670 A | 7/2009 |
| JP | 2010147222 A | 7/2010 |
| JP | 2012129504 A | 7/2012 |
| JP | 2012151470 A | 8/2012 |
| JP | 2014022708 A | 2/2014 |

* cited by examiner

SEMICONDUCTOR DEVICE HAVING OVERLOAD CURRENT CARRYING CAPABILITY

PRIORITY CLAIM

This application claims priority to German Patent Application No. 10 2014 226 161.9 filed on 17 Dec. 2014, the content of the application incorporated herein by reference in its entirety.

TECHNICAL FIELD

This specification refers to embodiments of semiconductor devices, embodiments of circuit arrangements comprising a semiconductor device and a gate driver, and further to embodiments of methods of operating a semiconductor device. In particular, this specification refers to embodiments of a Reverse Conducting Insulated Gate Bipolar Transistor, hereinafter also referred to as "RC-IGBT", and to embodiments of a Metal Oxide Semiconductor Controlled Diode, hereinafter also referred to as "MOS-controlled diode" or "MCD", that allow for conducting an overload current, such as an overload current in the reverse direction.

BACKGROUND

Many functions of modern devices in automotive, consumer and industrial applications, such as converting electrical energy and driving an electric motor or an electric machine, rely on semiconductor devices. For example Insulated Gate Bipolar Transistors (IGBTs) and diodes have been used for various applications including, but not limited to switches in power supplies and power converters.

A specific example of the applications is the so-called high voltage direct current (HVDC) transmission. This kind of energy transmission can be used for transporting a large amount of electrical power over a large distance of several kilometers, even several hundred kilometers. In short words, an alternating current (AC) or, respectively, an alternating voltage is generated by an AC generator, such as a wind turbine. After conversion into the high voltage level, the AC voltage/AC current is rectified by a converter station into a direct current (DC) or, respectively, into a DC voltage. The DC voltage/current is fed into a HVDC transmission line. At a receiving end of the HVDC transmission line, there may be installed a further converter station for converting the received DC energy into AC energy for further distribution.

One approach is to use reverse conducting IGBTs (RC-IGBT) in such converter stations.

SUMMARY

According to an embodiment, a semiconductor device is provided. The semiconductor device comprises a semiconductor region, wherein the semiconductor region exhibits charge carriers of a first conductivity type. The semiconductor device further comprises a transistor cell included in the semiconductor region and a semiconductor channel region included in the transistor cell. The semiconductor channel region comprises a first doping concentration of charge carriers of a second conductivity type complementary to the first conductivity type. A transition between the semiconductor channel region and the semiconductor region forms a first pn-junction. The semiconductor region further includes a semiconductor auxiliary region that is different from the semiconductor channel region and that comprises a second doping concentration of charge carriers of the second conductivity type. The second doping concentration is at least 30% higher as compared to the first doping concentration. A transition between the semiconductor auxiliary region and the semiconductor region forms a second pn-junction, the second pn-junction being positioned as deep or deeper in the semiconductor region as compared to the first pn-junction. The semiconductor auxiliary region is further positioned closest to the semiconductor channel region as compared to any other semiconductor region of the semiconductor device that comprises charge carriers of the second conductivity type and that forms a further pn-junction with the semiconductor region. The semiconductor device further comprises a diode cell included in the semiconductor region, the diode cell including a semiconductor anode region, wherein the semiconductor anode region comprises a third doping concentration of charge carriers of the second conductivity type, and wherein the second doping concentration is higher than the third doping concentration.

According to a further embodiment, a further semiconductor device is provided. The further semiconductor device is operable in at least one of a forward current mode and a reverse current mode and is configured for conducting a load current in a forward direction during the forward current mode and for conducting a load current in a reverse direction during the reverse current mode. The semiconductor device comprises a semiconductor region and a controllable charge carrier injector. The controllable charge carrier injector is configured to inject charge carriers into the semiconductor region and is responsive to a control signal. The controllable charge carrier injector is further configured to set the further semiconductor device, when being in the reverse current mode, either into a nominal state or into an overload state in dependence of the control signal. In the nominal state, the controllable charge carrier injector is configured to induce a first charge carrier density within the semiconductor region so as to allow the semiconductor region to conduct a nominal load current in the reverse direction. In the overload state, the controllable charge carrier injector is configured to induce a second charge carrier density within the semiconductor region so as to allow the semiconductor region to conduct an overload current in the reverse direction. The second charge carrier density is higher than the first charge carrier density.

According to another embodiment, a circuit arrangement is provided. The circuit arrangement comprises a semiconductor device and a gate driver that is operatively coupled to the semiconductor device. The semiconductor device is operable in at least one of a forward current mode and a reverse current mode and comprises a semiconductor region and a controllable charge carrier injector, wherein the controllable charge carrier injector is configured to inject charge carriers into the semiconductor region. The semiconductor device further comprises a gate electrode, wherein the gate electrode is electrically coupled to the controllable charge carrier injector and configured to receive a gate signal. The gate driver includes an overload current detector that is configured to detect if a load current in the reverse direction conducted by the semiconductor region exceeds a threshold value. The gate driver also comprises a gate signal generator for generating the gate signal. The gate signal generator is operatively coupled to the overload current detector. Further, the gate signal generator is configured to, if the overload current detector indicates that the present load current in the reverse direction does not exceed the threshold value, operate the semiconductor device in a nominal state by providing the gate signal with a voltage within a nominal voltage range such that the gate electrode causes the charge carrier injector to induce a first charge carrier density within the semiconductor region so as to allow the semiconductor region to conduct a nominal load current in the reverse direction. If the overload current detector indicates that the present load current in the reverse direction does exceed the threshold value, the gate signal generator is configured to operate the semiconductor device in an overload state by providing the gate signal with a voltage within an overload voltage range such that the gate electrode causes the charge carrier injector to induce a second charge carrier density within the semiconductor region so as to allow the semiconductor region to conduct an overload current in the reverse direction, wherein the second charge carrier density is higher than the first charge carrier density.

In accordance with yet another embodiment, a method of operating a semiconductor device is presented. The semiconductor device is operable in at least one of a forward current mode and a reverse current mode and comprises a semiconductor region, a controllable charge carrier injector that is configured to inject charge carriers into the semiconductor region. The semiconductor device further comprises a gate electrode that is electrically coupled to the controllable charge carrier injector and configured to receive a gate signal. The method comprises the following steps: detecting, in the reverse current mode, whether or not a load current in the reverse direction conducted by the semiconductor region exceeds a threshold value; if the present load current in the reversed direction does not exceed the threshold value, operating the semiconductor device in a nominal state by providing the gate signal with a voltage within a nominal voltage range such that the gate electrode causes the charge carrier injector to induce a first charge carrier density within the semiconductor region so as to allow the semiconductor region to conduct a nominal load current in the reverse direction; if the present load current in the reverse direction does exceed the threshold value, operating the semiconductor device in an overload state by providing the gate signal with a voltage within an overload voltage range such that the gate electrode causes the charge carrier injector to induce a second charge carrier density within the semiconductor region so as to allow the semiconductor region to conduct an overload current in the reverse direction, wherein the second charge carrier density is higher than the first charge carrier density.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings.

DETAILED DESCRIPTION

Figure 1:
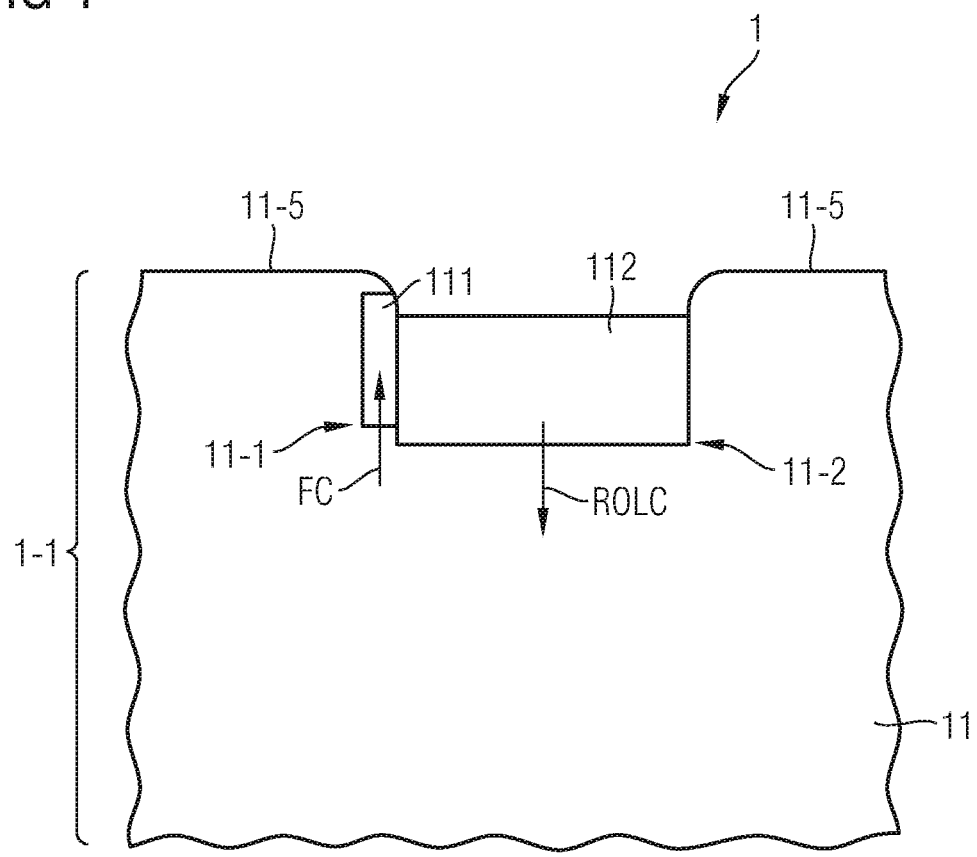
FIG. 1 schematically illustrates a section of a vertical cross-section of a semiconductor device according to one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor region. This can be for instance the surface of a wafer or a die.

The term "vertical" as used in this specification intends to describe an orientation which is substantially arranged perpendicular to the horizontal surface, i.e., parallel to the normal direction of the surface of the semiconductor substrate or semiconductor region.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

Specific embodiments described in this specification pertain to, without being limited thereto, a monolithically integrated RC-IGBT or to a monolithically integrated MCD, e.g. to a monolithically integrated power RC-IGBT or to a monolithically integrated power MCD that may be used within an electrical power converter, e.g., an electrical power converter for HVDC applications. For example, in a monolithically integrated RC-IGBT, both a transistor section and a diode section may be implemented on a common chip. However, it shall be understood that, in accordance with one or more embodiments described in this specification, the transistor section and the diode section of a RC-IGBT may be arranged on chips that are separated from each other. The separated diode section may be regarded as a MCD.

As used within the present specification, the term "forward current" may be a current that flows in one direction through the semiconductor device, e.g., from a backside of the semiconductor device to a frontside of the semiconductor device. Such forward current may be carried, e.g., by means of transistor cell of the semiconductor device. Further, as used within the present specification, the term "reverse current" may be a current that flows in another direction through the semiconductor device, e.g., from a frontside of the semiconductor device to a backside of the semiconductor device. For instance, such reverse current may be carried by a diode cell and/or by an auxiliary cell of the semiconductor device, as will be explained in more detail below. In certain embodiments, the semiconductor device may be configured to carry both a forward current and a reverse current. In other words, the semiconductor device may be operated in both a forward current mode and a reverse current mode, e.g., if the semiconductor device is a RC-IGBT. In other embodiments, the semiconductor device may only be configured to carry a load current in a single direction, such as the reverse direction and not a forward current, e.g., if the semiconductor device is a MCD. In other words, the term "reverse current" or, respectively "reverse current mode" as used within the present specification, may refer to a load current direction that is typical for a MCD, e.g., a load current that flows from, in terms of a technical current direction, an anode section of a MCD to a cathode region of a MCD. Thus, it shall be understood that within the present specification, the term "reverse current" typically refers to the load current that is carried by a MCD or, respectively, by a diode section of a RC-IGBT. Therefore, when presently speaking only of a MCD, the term "reverse current" is used for describing a load current that flows in a direction from an anode section to a cathode region, even though such load current direction would commonly not be described as a reverse current, but as a forward current of a MCD.

The term "power semiconductor device" as used in this specification intends to describe a semiconductor device on a single chip with high voltage blocking and/or high current-carrying capabilities. In other words, the power semiconductor devices are intended for high current, typically in the Ampere range, e.g., up to several hundred Ampere, and/or high voltages, typically above 1000 V, more typically 6000 V and above.

For example, power semiconductor devices can be used for so-called high voltage direct current (HVDC) transmission applications. This kind of energy transmission can be used for transporting a large amount of electrical power over a large distance of several kilometers, even several hundred kilometers. In short words, an alternating current (AC) or, respectively, an alternating voltage is generated by an AC generator, such as a wind turbine. After conversion into the high voltage level, the AC voltage/AC current is rectified by a converter station into a direct current (DC) or, respectively, into a DC voltage. The DC voltage/current is fed into a HVDC transmission line. At a receiving end of the HVDC transmission line, there may be installed a further converter station for converting the received DC energy into AC energy for further distribution.

Figure 11:
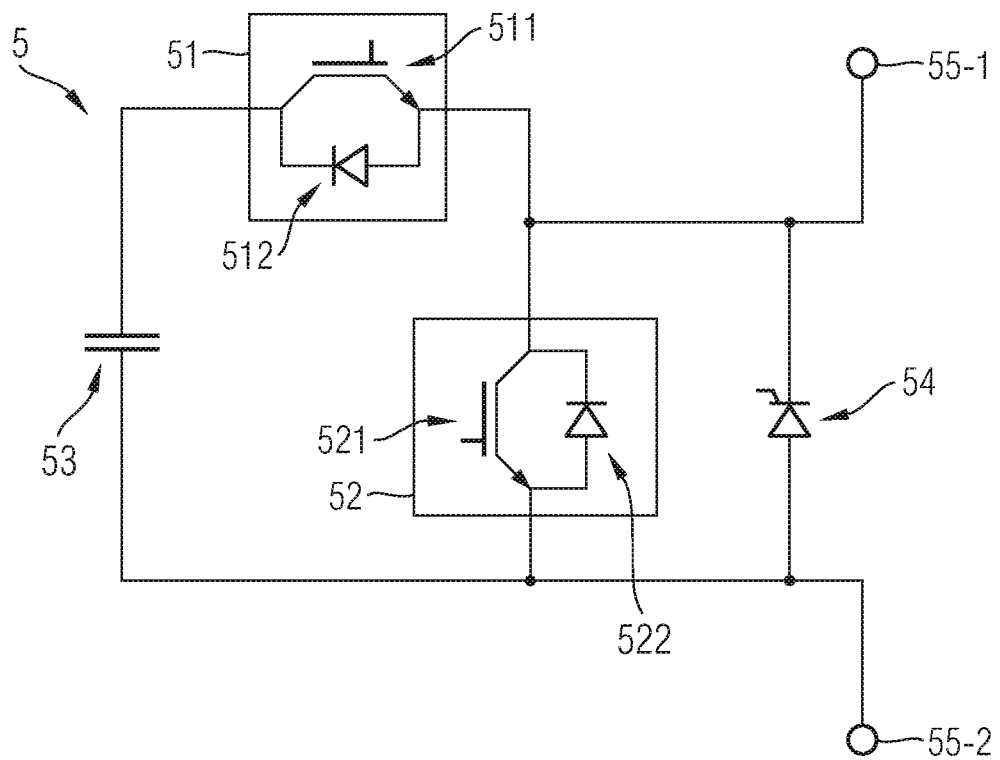
FIG. 11 schematically illustrates a circuit diagram of a section of a power converter.

One approach is to use RC-IGBTs in such converter stations. For example, FIG. 11 schematically illustrates a circuit diagram of a section of a power converter 5, which shall be briefly discussed in the following: The power converter 5 exhibits a so-called Modular-Multilevel-Converter (MMC) topology. The MMC topology is generally suitable for applications in HVDC transmission. The power converter 5 comprises a converter leg that includes a first RC-IGBT 51 and a second RC-IGBT 52. The converter leg is coupled to AC terminals 55-1 and 55-2 for receiving and/or outputting an AC voltage. On the other side, the converter leg is coupled to DC terminals, e.g., to a capacitor 53 that may be used for buffering a DC voltage rectified by the first RC-IGBT 51 and the second RC-IGBT 52 or, respectively, for buffering a DC voltage to be inverted by the first RC-IGBT 51 and the second RC-IGBT 52.

The first RC-IGBT 51 comprises a first transistor 511 and a first diode 512, wherein these two components may be implemented on a common chip. Correspondingly, the second RC-IGBT 52 comprises a second transistor 521 and a second diode 522, wherein also these two components may be implemented on a common chip. The first diode 511 and the second diode 522, which are also referred to as "freewheeling diodes" (FWD), are configured for conducting a load current in a direction that is reverse to the direction of a load current conducted by transistors 511 and 521, which is a forward direction. The change of direction of the load current is also referred to as "commutation", e.g., the load current may commutate from the second transistor 521 to the second diode 522 or, respectively, from the second diode 522 to the second transistor 521.

There may be situations in which an overload current may need to be temporarily conducted by the converter leg, such as by the second RC-IGBT 52. Such situation may arise, e.g., due to a short circuit between the DC terminals of the converter (also referred to as "DC Pole-to-Pole Fault"). In other situations, the overload current may be caused by the AC side. However, such overload current, which may be a multiple of a nominal load current, typically exceeds the current-carrying capacity of the freewheeling diodes, e.g., the current-carrying capacity of freewheeling diode 522.

For example, the overload current, e.g., the reverse overload current, may be at least ten times as high as the nominal load current, or even higher, such as twenty times as high as the nominal load current. Accordingly, a load current density within the RC-IGBT could increase by a corresponding factor, such as by ten, twenty and so on in an overload situation.

Speaking, e.g., of the second RC-IGBT 52, a thyristor 54 may be connected in parallel to the second diode 522 in order to increase the current-carrying capacity. In other words, the thyristor 54 constitutes a further current path external of the RC-IGBT 52. If it is detected that the load current in the reverse direction, i.e., the load current conducted by the second diode 522, exceeds a certain value, the thyristor 54 can be turned-on such that a significant part of the overload current is conducted by the thyristor 54.

Therefore, the power converter 5 may withstand an overload current. However, such additional thyristor 54, which constitutes a further power semiconductor device that needs to be controlled, could increase the complexity of the power converter 5. For example, it can be desirable to provide means that allow for realizing a less complex power converter, e.g., for realizing a less complex power converter that is suited for at least temporarily withstanding an overload current.

FIG. 1 schematically illustrates a section of a vertical cross-section of a semiconductor device 1 according to one or more embodiments. The semiconductor device 1 comprises a semiconductor region 11 that exhibits charge carriers of a first conductivity type. For example, the semiconductor region 11 is mainly a weakly n-doped region (n⁻-region). For instance, the semiconductor region 11 may comprise the drift region of the semiconductor device 1.

The semiconductor device 1 comprises a transistor cell 1-1, wherein a semiconductor channel region 111 is included in the transistor cell 1-1.

The semiconductor channel region 111 exhibits a first doping concentration of charge carriers of a second conductivity type that is complementary to the first connectivity type. For example, the semiconductor channel region 111 is mainly a normally p-doped semiconductor region (p-region). In an embodiment, the semiconductor channel region 111 may comprise or, respectively, be a so-called body region of the semiconductor device 1. For example, the semiconductor channel region 111 may be configured for producing an inversion layer within the semiconductor region 11 in dependence of an electrical control potential supplied to the semiconductor channel region 111.

Accordingly, a transition between the semiconductor channel region 111 and the semiconductor region 11 forms a first pn-junction 11-1. As indicated in FIG. 1, the first pn-junction 11-1 may extend into the semiconductor region 11 by a certain distance from a surface 11-5 of the semiconductor region 11.

Further, there is included a semiconductor auxiliary region 112 in the semiconductor region 11. The semiconductor auxiliary region 112 is positioned in close proximity to the semiconductor channel region 111. The semiconductor auxiliary region 112 is different from the semiconductor channel region 111 and exhibits a second doping concentration of charge carriers of the second conductivity type, the second doping concentration being higher than the first doping concentration. For example, the semiconductor auxiliary region 112 is mainly a highly doped p-region (p*-region).

Accordingly, a transition between the semiconductor auxiliary region 112 and the semiconductor region 11 forms a second pn-junction 11-2. The second pn-junction 11-2 is positioned as deep or deeper in the semiconductor region 11 as compared to the first pn-junction 11-1. For example, the distance between the surface 11-5 and the second pn-junction 11-2 is greater as compared to the distance between the first pn-junction 11-1 and the surface 11-5.

For example, the second pn-junction 11-2 is positioned at a depth that is some nm, such as 50 nm, 100 nm or 500 nm, or other values in the range between 50 nm to 1 μm, deeper as compared to the depth of the first pn-junction 11-1.

Further, the semiconductor auxiliary region 112 is positioned closest to the semiconductor channel region 111 as compared to any other semiconductor region of the semiconductor device 1 that comprises charge carriers of the second conductivity type and that forms a further pn-junction with the semiconductor region 11. Such further semiconductor regions are not indicated within FIG. 1; e.g., such further semiconductor regions comprises a p*-collector layer. For example, the semiconductor auxiliary region 112 may be a p*-region that is positioned closest to the semiconductor channel region 111 as compared to any other p-region of the semiconductor device 1, irrespectively whether that further p-region is a highly doped p-region or a weakly doped p-region or a normally doped p-region.

For example, the second doping concentration is at least twice as high as the first doping concentration, such as ten times as high, or even higher than ten times as high as the first doping concentration. The second doping concentration may be at least one order of magnitude (1E3) higher than the first concentration.

For example, the semiconductor device 1 is a RC-IGBT. According to another example, the semiconductor device 1 is a MCD.

In an embodiment, the semiconductor device 1 is operable in both a forward current mode and a reverse current mode, e.g., if the semiconductor device 1 is a RC-IGBT. In another embodiment, the semiconductor device 1 is operable only in a reverse current mode, e.g., if the semiconductor device 1 is a MCD.

In the forward current mode, a load current may be conducted by the semiconductor region 11 in a forward direction (indicated in FIG. 1 with reference numerals FC). For example, the semiconductor channel region 111 is configured for conducting at least a part of the nominal load current in the forward direction. In the reverse current mode, a load current is conducted by the semiconductor region 11 in the opposite direction.

For example, the semiconductor device 1, e.g., a RC-IGBT, is designed to be operated at an operating frequency of several hundred Hz. At a rate corresponding to such operating frequency, the nominal load current may commutate between a diode cell (not shown in FIG. 1) of the semiconductor device 1, which is a reverse direction, and a transistor cell of another semiconductor device (not shown in FIG. 1), which is a forward direction. To this end, the charge carrier density within the semiconductor region 11 is preferably kept under a certain level so as to allow commutation robustness of the diode cell during nominal conditions.

As introductorily mentioned, the semiconductor device 1 can be suited for being employed within a section of a power converter. Such section may be required to withstand an overload current, which may be a multiple of a nominal load current for which the semiconductor device 1 is nominally designed. For example, the overload current may be ten times or even higher, such as 20 times, as high as the nominal load current. To this end, the semiconductor auxiliary region 112 may be used in an overload situation for temporarily increasing the charge carrier density within the semiconductor region 11 so as to allow the semiconductor region 11 to conduct the overload current in the reverse direction. In FIG. 1, such overload current in the reverse direction is indicated with reference numerals ROLC. The semiconductor auxiliary region 112 may be configured for conducting at least a part, preferably at least a significant part of such overload current in the reverse direction. In other words, the reverse overload current may cross the second pn-junction 11-2. Further, the semiconductor auxiliary region 112 may be electrically connected to a load terminal, such as an anode terminal or an emitter terminal (not shown in FIG. 1) of the semiconductor device 1 by means of a low ohmic current path so as to allow for receiving, carrying and outputting at least a part of the reverse overload current. Thus, in accordance with an embodiment, the semiconductor auxiliary region 112 may not only be configured for serving as an additional charge carrier source, but also as a reverse overload current carrying element of the semiconductor device 1.

For example, when conducting the forward load current, the forward load current may follow a first load current path within the semiconductor device 1, wherein such first load current path crosses the first pn-junction 11-1, e.g., in a direction substantially perpendicular to a junction area of the first pn-junction 11-1. When conducting the reverse overload current, the reverse overload current may follow a second load current path that crosses the second pn-junction 11-2, e.g., in a direction substantially perpendicular to a junction area of the second pn-junction 11-2. Further, the first load current path may cross the semiconductor channel region 111 and/or the second load current path may cross the semiconductor auxiliary region 112.

In an embodiment, the semiconductor device 1 may exhibit an edge termination structure that surrounds an active region of the semiconductor device 1, wherein both the edge termination structure and the active region may be part of the semiconductor region 11. The semiconductor device 1 may be configured for carrying the load current mainly by means of the active region during nominal operation, and the semiconductor device 1 may also be configured for carrying the load current by means of both the active region and the edge termination structure during the overload state. Further, during the overload state, the load current density may be substantially evenly distributed between the edge termination structure and the active region, at least more evenly as compared to the nominal operation.

For example, the reverse overload current (ROLC) may be detected by an application, e.g. a gate driver, which will be explained in more detail below. In a ROLC case, the diode cell (not shown in FIG. 1) of the semiconductor device 1 must, e.g., not necessarily block against a voltage; typically, there is no so-called reverse recovery process during a ROLC case. Rather, current zero crossing may be defined by the AC grid. Consequently, commutation robustness may not be a requirement anymore during a ROLC case.

Thus, referring only to ROLC cases, the semiconductor device 1 must not necessarily exhibit commutation robustness. Therefore, providing the semiconductor device 1 which may be switched between a nominal state satisfying the regular commutation robustness and an overload state sacrificing the commutation robustness for significantly reduced ROLC conduction losses, i.e., higher ROLC robustness, may be advantageous.

The aforementioned exemplary functional aspect regarding the overload current carrying capacity of the semiconductor device 1 illustrated in FIG. 1 shall be explained in more detail with reference to the remaining drawings. However, prior to going into more detail regarding the functional aspect, further examples of structures of semiconductor devices also being suited for fulfilling the functional aspect shall be explained with respect to FIG. 2 to FIG. 5.

Figure 2:
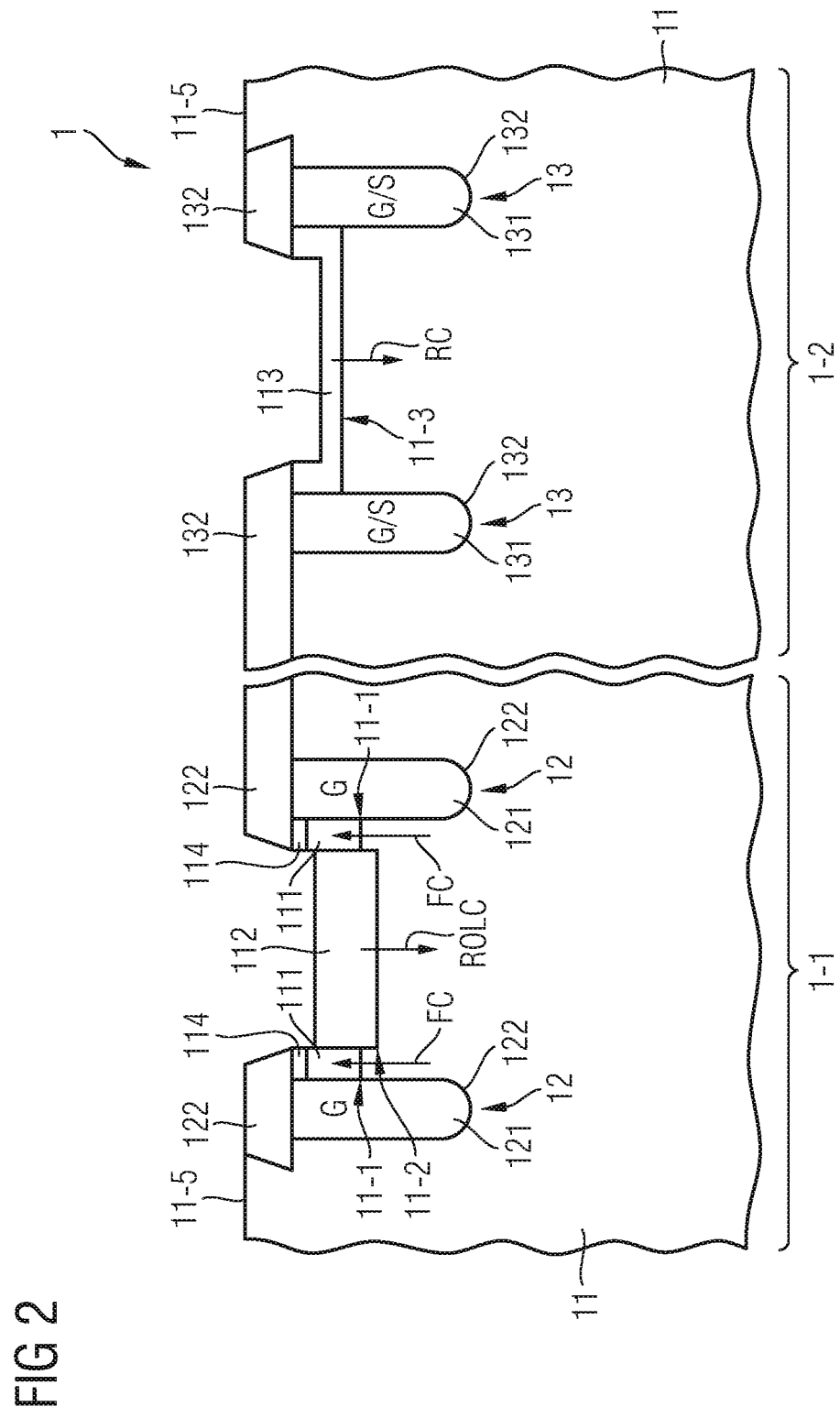
FIG. 2 schematically illustrates a section of a vertical cross-section of a semiconductor device according to one or more embodiments.

FIG. 2 schematically explains a section of a vertical cross section of a semiconductor device 1, e.g., a RC-IGBT, according to one or more further embodiments. The semiconductor device 1 comprises a transistor cell 1-1, which exhibits a similar setup as compared to the transistor 1-1 illustrated in FIG. 1. Further, the semiconductor device 1 comprises a neighboring diode cell 1-2.

The diode cell 1-2 may be configured for conducting a nominal load current in the reverse direction RC, e.g., by means of a semiconductor anode region 113. The semiconductor anode region 113 exhibits a third doping concentration of charge carriers of the second conductivity type. For example, the third doping concentration is lower than the second doping concentration of charge carriers of the semiconductor auxiliary region 112. The semiconductor anode region 112 may be mainly a normally p-doped region (p-region). Accordingly, a transition, between the semiconductor anode region 113 and the semiconductor region 11 forms a third pn-junction 11-3.

For example, the diode cell 1-2 is configured not to carry a load current in the forward direction. The diode cell 1-2 may be configured for ensuring that no inversion layer comes into being within a path, such as on ohmic path or a unipolar path, between the semiconductor region 11 and the semiconductor source regions 114 and/or the gate electrodes 121.

The second pn-junction 11-2 between the auxiliary semiconductor region 112 and the semiconductor region 11 is positioned as deep as or deeper than the third pn-junction 11-3. For example, the distance between the third pn-junction 11-3 and the surface 11-5 is smaller than the distance between the second pn-junction 11-2 and the surface 11-5. For example, the second pn-junction 11-2 is positioned at a depth that is some nm, such as 50 nm, 100 nm or 500 nm, or other values in the range between 50 nm to 1 μm deeper as compared to the depth of the third pn-junction 11-3.

The semiconductor device 1 may comprise a plurality of first trenches 13, wherein at least two of these first trenches 13 can be included in the diode cell 11-2. Each first trench extends vertically into the semiconductor region 11 and comprises a first electrode 131, which may be a source electrode or a gate electrode, and a first dielectric 132, wherein each first dielectric 132 insulates the first electrode 131 of the respective first trench 13 from the semiconductor body 11. As indicated in FIG. 2, the semiconductor anode region 113 may be positioned between two first trenches 13 and may be in contact with the first dielectrics 132 of the two first trenches 13.

The semiconductor device 1 may further comprise a plurality of second trenches 12, wherein at least two of these second trenches 12 can be included in the transistor cell 1-1. Each second trench 12 extends vertically into the semiconductor region 11 and may comprise a gate electrode 121 and a second dielectric 122. Each second dielectric 122 insulates the gate electrode 121 of the respective second trench 12 from the semiconductor region 11.

The transistor cell 1-1 may further include semiconductor source regions 114 that are in contact with the semiconductor channel regions 111. For example, the semiconductor source regions 114 comprise charge carriers of the first conductivity type, wherein a charge carrier density of the semiconductor source regions 114 may be higher as compared to the charge carrier density of the semiconductor region 11. For example, the semiconductor source regions 114 are n+-regions and the semiconductor region 11 is mainly a n⁻-region. As illustrated in FIG. 2, the semiconductor auxiliary region 112 may be in contact with the adjacent semiconductor channel regions 111 and be positioned between the two second trenches 12.

In an embodiment, the semiconductor device 1, is configured for conducting the load current in the forward direction (FC) if a voltage between a collector terminal or, respectively, a cathode terminal (not shown) of the semiconductor device 1 and an emitter terminal or, respectively, an anode terminal (not shown) of the semiconductor device 1 is greater than 0 V ($V_{CE}$>0 V). In other words, the semiconductor device 1 may be configured for blocking a reverse load current, if the voltage is greater than 0 V.

Further, the semiconductor device 1 may be configured for conducting the load current in the reverse direction (RC) if a voltage between a collector terminal or, respectively, a cathode terminal (not shown) of the semiconductor device 1 and an emitter terminal or, respectively, an anode terminal (not shown) of the semiconductor device 1 is smaller than 0 V ($V_{CE}$<0 V).

The emitter terminal (not shown) may be electrically connected to the semiconductor source regions 114 and the anode terminal (not shown) may be electrically connected to the semiconductor anode regions 113. The collector terminal (not shown) may be electrically connected to a semiconductor collector region (not shown) that can be in contact with the semiconductor region 11 and positioned below the semiconductor region 11, and the cathode terminal (not shown) may be electrically connected to a semiconductor cathode region that may include at least parts of the semiconductor region 11.

Figure 3:
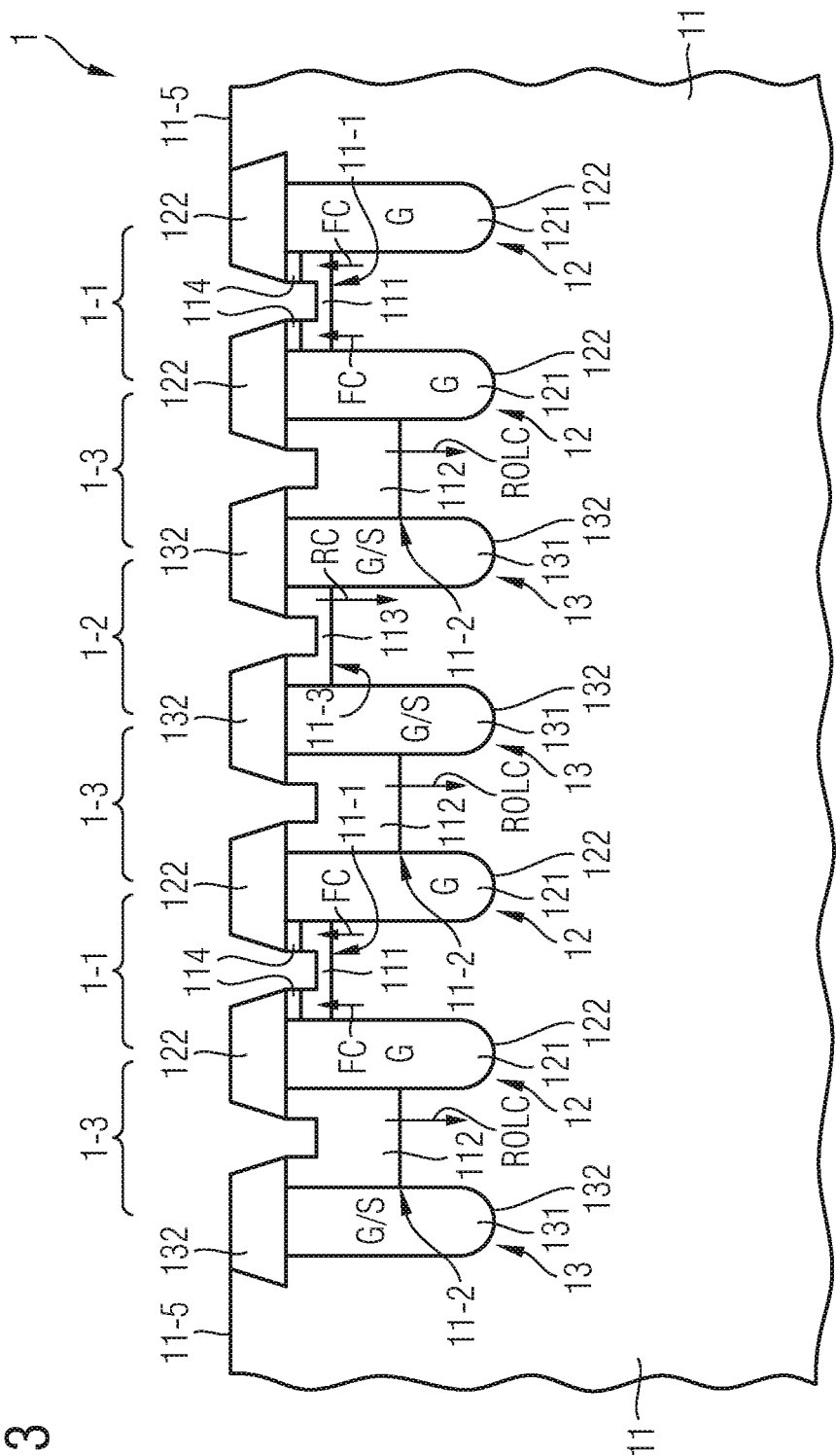
FIG. 3 schematically illustrates a section of a vertical cross-section of a semiconductor device according to one or more embodiments.

FIG. 3 illustrates a section of a vertical cross-section of a semiconductor device 1 according to one or more further embodiments. Accordingly, the semiconductor device 1 may comprise a plurality of transistor cells 1-1 and the semiconductor auxiliary region 112 may be positioned outside of the transistor cells 1-1. For example, each semiconductor auxiliary region 112 is separated from each semiconductor channel region 111 by means of at least one of the second trenches 12. In other words, a second trench 12 may be positioned between a respective semiconductor auxiliary region 112 and a respective semiconductor channel region 111. The respective semiconductor auxiliary region 112 may be in contact with both the first dielectric 132 of one of the first trenches 13 and in contact with the second dielectric 122 of the second trench 12 that separates the semiconductor auxiliary region 112 from the semiconductor channel region 111.

The combination of the semiconductor auxiliary region 112, the adjacent first trench 13 and the adjacent second trench 12 may constitute an auxiliary cell 1-3. As indicated in FIG. 3, the semiconductor device 1 may comprise a plurality of such auxiliary cells 1-3 and a plurality of transistor cells 1-1 as well as a plurality of diode cells 1-2. For example, each transistor cell 1-1 is neighbored by two adjacent auxiliary cells 1-3. Also, each diode cell 1-2 may be neighbored by two auxiliary cells 1-3, as indicated in FIG. 3.

With respect to FIG. 3, it shall be understood that, in accordance with one or more embodiments, the transistor cells 1-1, the diode cells 1-2 and the auxiliary cells 1-3 may be implemented on a common chip, e.g., for forming a monolithically integrated RC-IGBT. Alternatively, the diode cells 1-2 and the auxiliary cells 1-3 may implemented on a separated chip, e.g., for forming a MCD.

In accordance with an embodiment, e.g., if the semiconductor device 1 of FIG. 3 is a RC-IGBT, a respective diode cell 1-2 is positioned in greater distance from a respective transistor cell 1-1 as compared to the auxiliary cells 1-3. In other words, a distance between a respective auxiliary cell 1-3 and a respective transistor cell 1-1 may be lower compared to a distance between a respective diode cell 1-2 and the transistor cell 1-1. Or, a cell being closest to a respective transistor cell 1-1 may either be another transistor cell 1-1 or an auxiliary cell 1-3, but, according to an example, not a diode cell 1-2. Arranging the diode cell 1-2 in greater distance to the transistor cell 1-1 as compared to a distance between the auxiliary cell 1-3 and the transistor cell 1-1 may be supportive for the injection of charge carriers into the semiconductor region 11 during nominal operation (no overload current) of the semiconductor device 1.

In an embodiment, with respect to the total area of the semiconductor region 11 available, the density of the auxiliary cells 1-3 may be substantially constant over the entire chip of the semiconductor device 1. For example, the density of the auxiliary cells 1-3 included in the active region may be substantially equal to the density of the auxiliary cells 1-3 included in the edge termination structure that surrounds the active region. Further, still with respect to the total area of the semiconductor region 11 available, the density of the transistor cells 1-1 and the density of the diode cells 1-2 included in the edge termination structure may each be lower as compared to the density of the transistor cells 1-1 and the density of the diode cells 1-2, respectively, included in the active region.

In another embodiment, with respect to the total area of the semiconductor region 11 available, there may be more auxiliary cells 1-3 arranged within the edge termination structure of the semiconductor device 1 as compared to the number of auxiliary cells 1-3 arranged within the active region of the semiconductor device 1. In other words, the density of the auxiliary cells 1-3 within the edge termination structure may be higher as compared to the density of the auxiliary cells 1-3 within the active region.

As has been elaborated above, the semiconductor device 1 may be configured for carrying the load current mainly by means of the active region during nominal operation, and the semiconductor device 1 may further be configured for carrying the load current by means of both the active region and the edge termination structure during the overload state. To this end, the transistor cells 1-1 and the diode cells 1-2 may be mainly arranged within active region of the semiconductor device 1 and the auxiliary cells 1-3 may be mainly arranged within the edge termination structure of the semiconductor device 1. Thus, within the active region of the semiconductor device 1, the density of transistors cells 1-1 and of the diode cells 1-2 may be comparatively high so as to allow carrying the load current in the forward direction and the reverse direction mainly by means of the active region during nominal operation. Further, within the edge termination structure of the semiconductor device 1, the density of the auxiliary cells 1-3 may be comparatively high so as to allow carrying the overload current in the reverse direction by means of both the active region and by means of the edge termination structure during overload state of the reverse current mode.

According to the aforementioned, the ratio between the volume of the semiconductor auxiliary region(s) 112 and the semiconductor anode region(s) 113 may increase in a direction from a center of the active region to the edge termination structure of the semiconductor device 1. Additionally, the ratio between the volume of the semiconductor auxiliary region(s) 112 and the semiconductor channel region(s) 111 may increase in a direction from the center of the active region to the edge termination structure of the semiconductor device 1.

Figure 4:
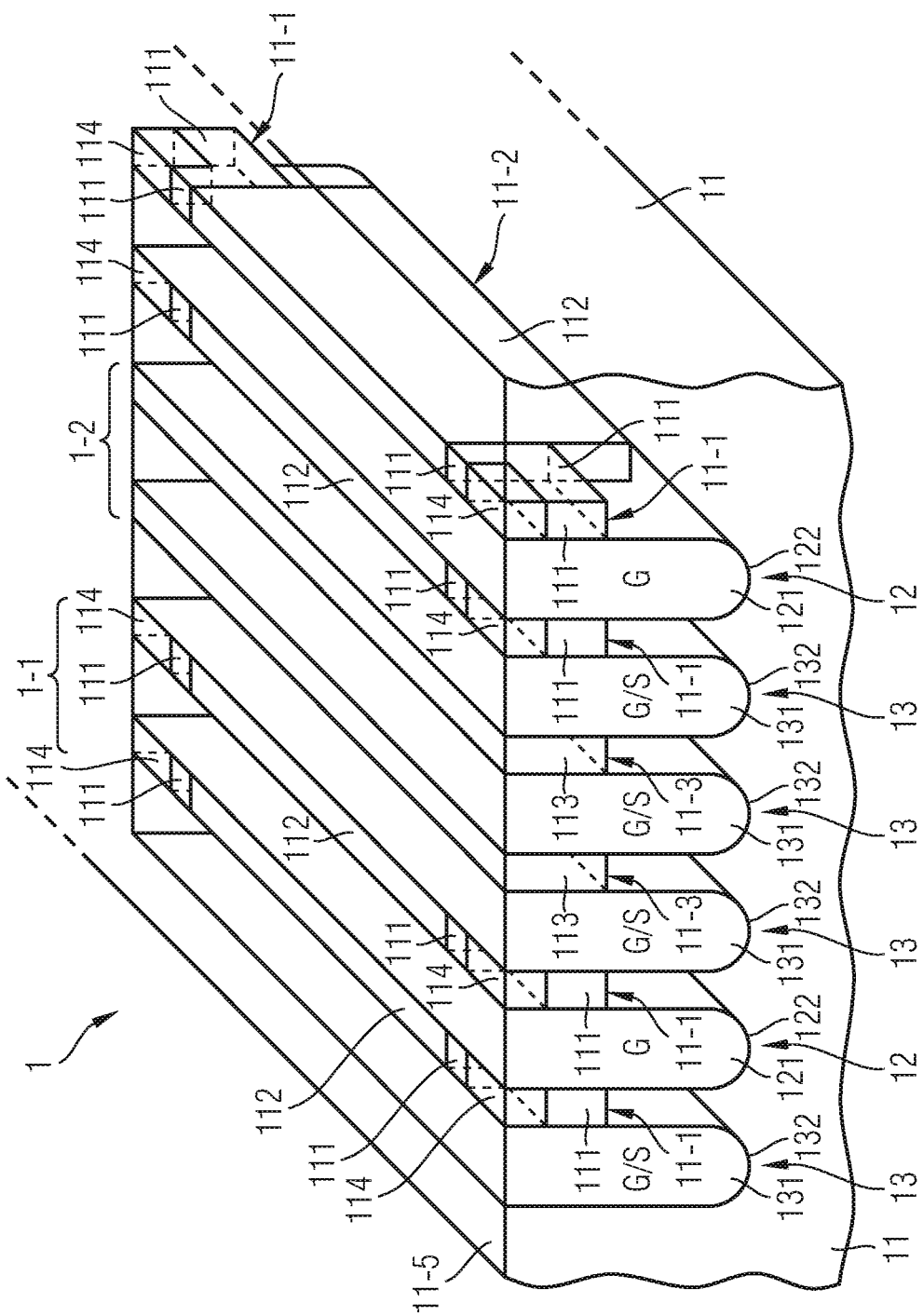
FIG. 4 schematically illustrates, in a perspective view, a section of a vertical cross-section of a semiconductor device according to one or more embodiments.

According to a further embodiment, a section of a vertical cross-section of which is illustrated, in a perspective view, in FIG. 4, the semiconductor device 1 may exhibit a stripe cell configuration. In this embodiment, no separate auxiliary cells 1-2 are provided; rather, the semiconductor auxiliary regions 112 are each included in a respective transistor cell 1-1. The semiconductor auxiliary regions 112 each extend deeper into the semiconductor region 11 as compared to adjacent semiconductor channel regions 111. Accordingly, the second pn-junctions 11-2 formed by transitions between the semiconductor auxiliary regions 112 and the semiconductor region 11 are positioned at a greater distance from the surface 11-5 as compared to the first pn-junctions 11-1.

Figure 5:
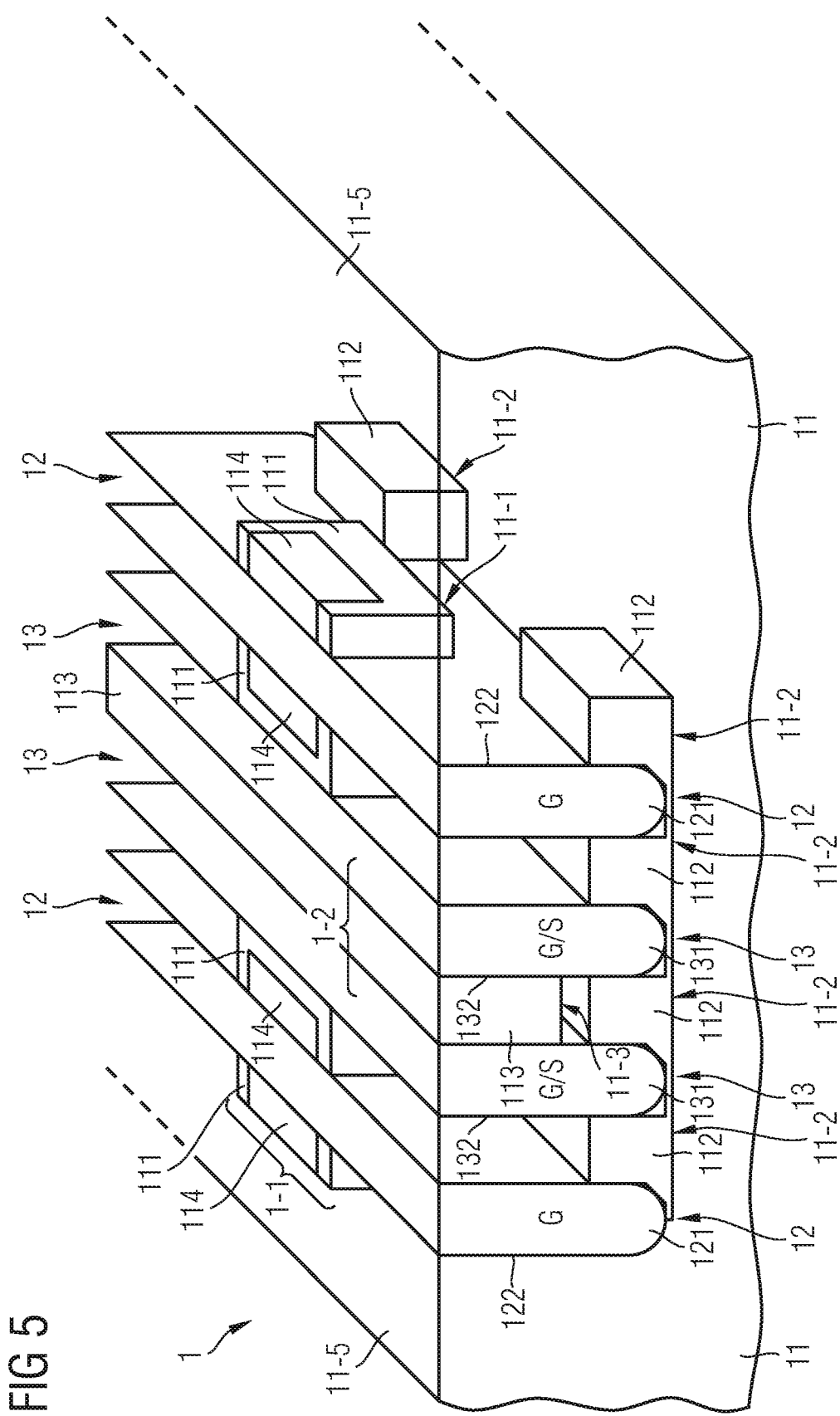
FIG. 5 schematically illustrates, in a perspective view, a section of a vertical cross-section of a semiconductor device according to one or more embodiments.

According to yet a further embodiment, a section of a vertical cross-section of which is schematically illustrated, in a perspective view, in FIG. 5, the semiconductor auxiliary regions 112 may extend, in a horizontal direction, in regions of both a diode cell 1-2 and a transistor cell 1-1 of the semiconductor device. In this embodiment, the semiconductor auxiliary regions 112 are positioned substantially deeper in the semiconductor region 11 as compared to the semiconductor channel regions 111, e.g., such that the semiconductor auxiliary regions 112 on the one side and the semiconductor channel regions 111 on the other side are separated from each other by parts of the semiconductor region 11. In an embodiment, the semiconductor auxiliary regions 112 and the semiconductor channel regions 111 may form a pnp-FET (pnp-Field Effect Transistor).

Still referring to FIG. 5, the semiconductor auxiliary regions 112 may be in contact with the respective adjacent second trenches 12. Further, the semiconductor auxiliary regions 112 may be in contact with the respective adjacent first trenches 13. For example, the semiconductor auxiliary regions 112 extend approximately as deep into the semiconductor region 11 as compared to the first trenches 13 and the second trenches 12 and are not in contact with the semiconductor channel regions 111. It shall be noted that the structure illustrated in FIG. 5 may be combined with the structure illustrated in FIG. 4 or FIG. 3.

Also with respect to FIG. 5, it shall be understood that, in accordance with one or more embodiments, the transistor cells 1-1 and the diode cells 1-2 and the auxiliary semiconductor regions 112 may implemented on a common chip, e.g., for forming a monolithically integrated RC-IGBT. Alternatively, the diode cells 1-2 and the auxiliary semiconductor regions 112 may implemented on a separated chip, e.g., for forming a MCD.

In the following, functional aspects of the semiconductor devices 1 illustrated in FIG. 1 to FIG. 5 shall be explained in more detail. To this end, it will additionally be referred to FIG. 6, which schematically illustrates a circuit diagram of a circuit arrangement 3, to FIG. 7, which schematically illustrates a flow diagram of a method of operating a semiconductor device, and to FIG. 8, which schematically and exemplary illustrates a diagram indicating an amount of charge Q included in the semiconductor device 1 being in the reverse current mode in dependence of a voltage V of a gate signal.

For instance, in case the semiconductor device to be operated is a RC-IGBT, the voltage V may be the difference between the electrical potential of a gate terminal electrically connected to the gate electrodes 121 and the electrical potential of an emitter terminal electrically connected to the semiconductor source regions 114. Such voltage V may be the voltage that is, in the context of RC-IGBTs, commonly referred to as "$V_{GE}$". In case the semiconductor device to be operated is a MCD, the voltage V may be the difference between the electrical potential of a gate terminal electrically connected to the gate electrodes 121 and the electrical potential of an anode terminal that may be electrically connected to the semiconductor anode regions 113 and to the semiconductor auxiliary regions 112.

Figure 6:
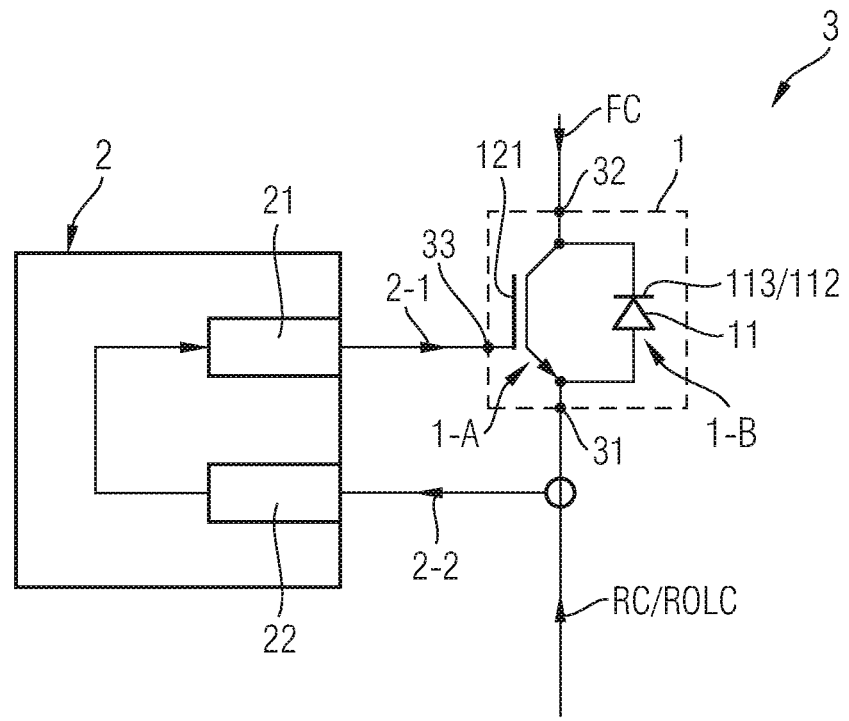
FIG. 6 schematically illustrates a circuit diagram of a circuit arrangement according to one or more embodiments.

In short words, the circuit arrangement 3 illustrated in FIG. 6 comprises a semiconductor device 1, e.g. a RC-IGBT or a MCD, which may exhibit a structure similar or identical to the structures illustrated in one or more of FIG. 1 to FIG. 5. Further, the circuit arrangement 3 comprises a gate driver 2 that is operatively coupled to the semiconductor device 1 and that comprises a gate signal generator 21 for generating a gate signal 2-1 and an overload current detector 22 for receiving a measurement signal 2-2 that is indicative of a present load current in the reverse direction conducted by the semiconductor device 1. For example, for implementing the method 4 illustrated in FIG. 7, the gate driver 2 may be used, which will be explained in more detail below.

The following explanation is mainly directed to embodiments where the semiconductor device 1 illustrated in FIG. 6 is implemented as a RC-IGBT. However, it shall be understood that the same operating principles may be analogously applied to the semiconductor device 1 in the form of a MCD, if the semiconductor device 1 is only operated in the reverse current mode. To this end, the semiconductor device 1 of FIG. 6 must not necessarily comprise a transistor section 1-A, but may comprise, in accordance with one or more embodiments, essentially only a gate controlled diode section 1-B that may be formed, e.g., by one or more of the diode cells 1-2 and one or more of the auxiliary cells 1-3.

For operating the semiconductor device 1, the gate signal 2-1 can be provided to the gate electrodes 121, e.g., by means of the gate signal generator 21. For example, if the semiconductor device 1 is operated in the nominal state of the reverse current mode (no overload current), the gate signal 2-1 is provided with a voltage V mainly within a nominal voltage range $R_1$ indicated in FIG. 8, wherein this nominal voltage range $R_1$ includes values that are equal to or greater than critical voltage $V_{crit}$. The nominal voltage range $R_1$ may include a threshold voltage Vt. For example, a voltage V higher than the threshold voltage $V_{th}$ may create an inversion channel in the semiconductor region 11. Even though FIG. 8 indicates that the critical voltage $V_{crit}$ can be smaller than 0 V and that the threshold voltage V can be larger than 0 V, it should be noted that the values of the voltages may be modified by means of different semiconductor structures. Also, it should be noted the V can be almost identical to $V_{crit}$ in certain configurations.

For example, if the semiconductor device 1 is a RC-IGBT, under nominal conditions, the gate signal generator 21 may provide the gate signal 2-1 with at least two alternating values, the values being within the nominal voltage range $R_1$, at an operating frequency, for example at an operating frequency of several hundred Hz. The semiconductor device 1 is turned-on and turned-off at the operating frequency.

When being turned-on, the reverse semiconductor device 1 (as exemplary illustrated in FIG. 1 to FIG. 6) may conduct a forward load current FC, e.g., by means of the transistor cells 1-1, such as by means of the semiconductor channel regions 111 and the semiconductor source regions 114.

For example, when being coupled to an external load circuit, such as an AC grid, the semiconductor device 1 may need to conduct a reverse load current RC, which may occur, e.g., by means of the diode cells 1-2, such as by means of the semiconductor anode regions 113.

Further, in the forward current mode, the gate electrodes 121 may be configured for turning-off the semiconductor device 1 based on the received gate signal 2-1 so as to block flow of a load current in the forward direction (FC).

Figure 8:
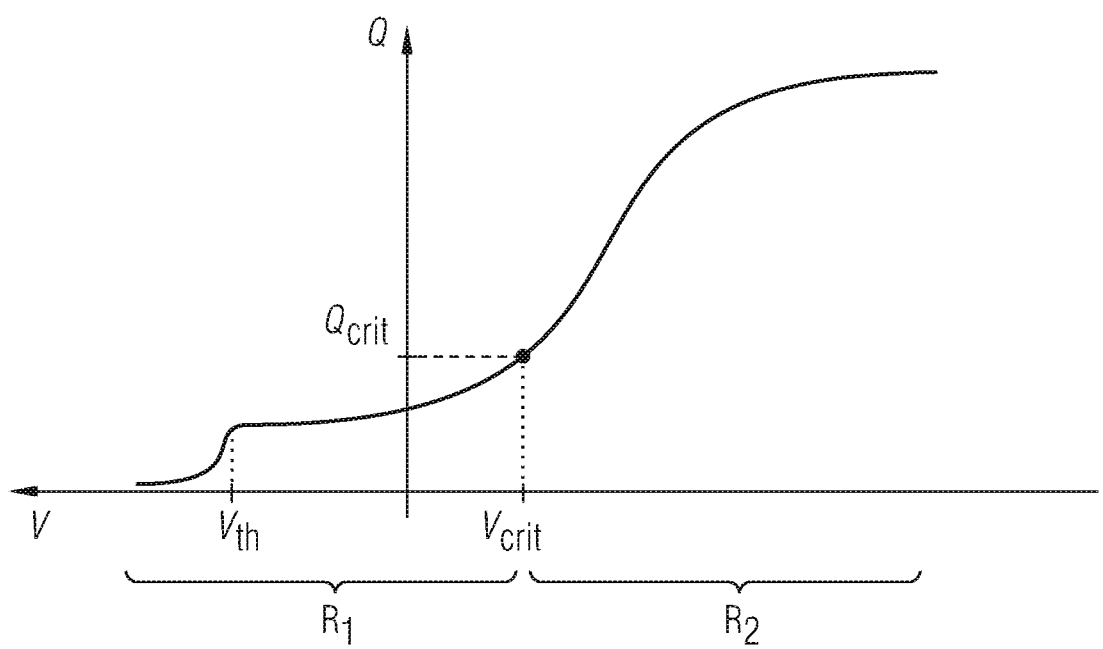
FIG. 8 schematically and exemplary illustrates a diagram indicating an amount of charge included in a semiconductor device being in a reverse current mode in dependence of a voltage of a gate signal.

During such nominal operation at the operating frequency, it may be required that the semiconductor device 1 exhibits commutation robustness. For example, the semiconductor device 1 shall ensure that further devices coupled to the semiconductor device 1 can withstand changes in the direction of the load current at rate corresponding to the operating frequency, e.g., changes from a reverse load current to a forward load current. To this end, it may be required that the total amount of charge Q included in the semiconductor region 11 does not exceed a critical amount $Q_{crit}$, as indicated in FIG. 8, when the semiconductor device 1 is in the reverse current mode. In other words, the density of charge carriers within the semiconductor region 11 shall sometimes be kept under a certain level in order to ensure commutation robustness during nominal operation.

Since the amount of charge Q included in the semiconductor region 11 can depend on the voltage V of the gate signal 2-1, it may be required that, during nominal operation of the semiconductor device 1 being in the nominal state of the reverse current mode (no overload current), the voltage of the gate signal 2-1 remains mainly within the nominal voltage range $R_1$. For example, during nominal operation in the reverse current mode, only the semiconductor anode region 113 is used for injecting charge carriers into the semiconductor region 11. That is to say: by means of the semiconductor anode region 113, a first charge carrier density is induced within the semiconductor region 11 so as to allow the semiconductor region 11 to conduct a nominal load current in the reverse direction. However, the semiconductor auxiliary region 112 is preferably not used during nominal operation in the reverse current mode of the semiconductor device 1, e.g., neither for charge carrier injection nor as a load current carrying element. For instance, during nominal operation, the load current does not cross the semiconductor auxiliary region 112. For example, it may be ensured that the semiconductor auxiliary region 112 injects substantially no charge carriers into the semiconductor region 11 during nominal operation at the operating frequency. For example, the semiconductor auxiliary region 112 may be configured for refraining from injecting charge carriers into the semiconductor region 11 if the gate signal 2-1 is provided with a voltage V within the nominal voltage range $R_1$.

However, if it is detected that the reverse load current RC is substantially greater than the nominal load current for which the semiconductor device 1 is nominally designed, the gate signal 2-1 may be provided with a voltage V within an overload voltage range $R_2$ indicated in FIG. 8, e.g., by means of the gate signal generator 21. For example, all voltage values included in the overload voltage range $R_2$ are smaller as compared to any voltage value included in the nominal voltage range $R_1$.

By providing the gate signal 2-1 with a voltage V within the overload voltage range $R_2$ exemplary indicated in FIG. 8, the semiconductor device 1 is, when being in the reverse current mode, set into an overload state during which the total amount of charge carriers within the semiconductor region 11 is substantially increased, e.g., by means of the semiconductor auxiliary region 112. In other words, the semiconductor auxiliary region 112 may be electrically coupled to the gate electrodes 121, e.g., capacitively coupled such that the semiconductor auxiliary region 112 injects charge carriers into the semiconductor region 11 if the gate signal 2-1 is provided with a voltage within the overload voltage range $R_2$. In this case, both the semiconductor anode region 113 and the semiconductor auxiliary region 112 inject charge carriers into the semiconductor region 11 such that a second charge carrier density is induced within the semiconductor region 11, wherein this second charge carrier density is significantly higher than the first charge carrier density present during nominal operation of the semiconductor device 1. Due to the increased charge carrier density, the semiconductor device 1 is configured for conducting a reverse overload current ROLC. Further, in the overload state, the semiconductor auxiliary region 112 may serve as a load current carrying element of the semiconductor device 1, i.e., at least a part of the reverse overload current may cross the second pn-junction 11-2 and may traverse the semiconductor auxiliary region 112. To this end, the semiconductor auxiliary region 112 may be electrically connected to a load contact of the semiconductor device 1 by means of a low ohmic current path so as to allow receiving and outputting the part of the reverse overload current.

For example, the semiconductor device 1 is operated in the overload state by providing the gate signal 2-1 with a voltage V within the overload voltage range $R_2$ for at least a minimum time period. For example, the minimum time period exhibits a length of at least 100 μs, such as 1 ms, 10 ms or 100 ms or other values in between the range of 100 μs to 100 ms. In other words, the overload state may last at least as long as the minimum time period. Further, the length of the minimum time period may be multiple of the reciprocal value of the operating frequency at which the semiconductor device 1 may nominally (no overload state) be operated at.

Further, after the minimum time period is over, i.e., after the ROLC situation is over, the semiconductor device 1 may be operated in the forward current mode and in the nominal state of the reverse current mode again.

In an embodiment, the semiconductor device 1 may be used within a power converter coupled to an AC grid, e.g., within a power converter exhibiting a MMC topology that is used for a HVDC application. The frequency of the voltage of the AC grid may amount to, e.g., 50 Hz, 60 Hz or similar values. If a grid error comes into being, a current limiter or other protective means typically installed within the AC grid may react to such fault. E.g., such current limiter may react within a time period corresponding to a sinus half wave or a multiple thereof, e.g., within a time period of 10 ms in case of a 50 Hz AC grid or, respectively, within a time period of 8.33 ms in case of a 60 Hz AC grid. For example, the minimum time period lasts at least as long as the duration of such sinus half wave of the AC grid to which the power converter including the semiconductor device 1 may be coupled. For example, the minimum time period is longer than 10 ms, 20 ms or longer than 30 ms.

During the overload state, the gate signal generator 21 may ensure that the voltage V of the gate signal 2-1 remains within the overload voltage range $R_2$. For instance, during the overload state, it is not ensured that the semiconductor device 1 exhibits commutation robustness. Rather, when being in the overload state, the semiconductor device 1 does not exhibit commutation robustness.

For example, the nominal voltage range $R_1$ includes voltage values in between +15 V and −15 V and, the overload voltage range $R_2$ includes voltages values in between −15 V to −40 V. It shall be understood that these exemplary ranges may be modified by corresponding variations of the structure, doping concentrations, doping materials and/or semiconductor materials of the semiconductor device 1. However, the overload voltage range $R_2$ typically does not include voltage values that are part of the nominal voltage range $R_1$.

According to the aforementioned, the semiconductor auxiliary region 112 and the semiconductor anode region 113 may be considered as a controllable charge carrier injector that is configured for injecting charge carriers into the semiconductor region 11 and that is responsive to a control signal, wherein this control signal can be generated by means of the gate signal 2-1 produced, e.g., by the gate signal generator 21 of gate driver 2, as has been explained above. In other words, an effective anode efficiency of the region composed of the semiconductor auxiliary region(s) 112 and the semiconductor anode region(s) 113 may be controllable by means of the gate signal 2-1. Further, the region comprising the semiconductor auxiliary region(s) 112 and the semiconductor anode region(s) 113 may be operated as the controllable charge carrier injector if the first electrodes 131 and the gate electrodes 121 exhibit approximately the same electrical potential, e.g., if the first electrodes 131 and the gate electrodes 121 are both at gate potential, wherein the gate potential may be the electrical potential of a gate terminal of the semiconductor device 1 (cf. gate terminal 33 explained below). Also, it shall be understood that, in accordance with one or more embodiments, both the semiconductor anode region 113 and the semiconductor auxiliary region 112 may not only be configured for serving as a charge carrier source, but also for serving as a respective reverse load current carrying element of the semiconductor device 1.

For controlling such charge carrier injector, the semiconductor auxiliary region 112 may be capacitively coupled to the gate electrodes 121. The gate signal 2-1 may be provided to the gate electrodes 121. Further, by providing the gate signal 2-1 with a voltage within the overload voltage range $R_2$, the charge carrier density included within the semiconductor region 11 may be significantly increased, for example by a factor of 1E2 as compared to the first charge carrier density. It should be noted that an increase of charge carriers may further depend on the amplitude of the reverse overload current. Due to the increased charge carrier density, the semiconductor device 1 may not exhibit commutation robustness anymore; however, the semiconductor device 1 may then capable of carrying the reverse overload current ROLC without suffering any damages.

Regarding the embodiments according to FIG. 2, a part of the reverse load current may be also conducted by transistor cell 1-1 if the semiconductor device 1 is in the nominal state of the reverse current mode, such as the semiconductor auxiliary region 112 adjacent to the semiconductor channel regions 111 is not being used, e.g., does not inject any charge carriers into the semiconductor region 11. The additional diode cell 1-2 is positioned at a greater distance to the transistor cell 1-1 such that it may ensure sufficient injection of charge carriers, such as holes, into the semiconductor region 11 during nominal operation of the semiconductor device 1.

Regarding now in more detail the circuit arrangement 3 schematically illustrated in FIG. 6, the gate driver 2 is operatively coupled to the semiconductor device 1, e.g. a RC-IGBT, to be controlled. In FIG. 6, the semiconductor device 1 to be controlled is illustrated by means of a circuit symbol. In a simplified manner, the semiconductor device 1 comprises a transistor section 1-A, in the following referred to as transistor 1-A, and a diode section 1-B, in the following referred to as freewheeling diode 1-B, connected in anti-parallel to the transistor 1-A. Both the transistor 1-A and the freewheeling diode 1-B may be implemented on a common chip. Alternatively, as illustrated above, the transistor 1-A and the freewheeling diode 1-B may be implemented on chips separated from each other, thereby forming, e.g., an IGBT and a MCD separated thereof.

The transistor 1-A may comprise one or more of the transistor cells 1-1 for carrying a forward load current and the freewheeling diode 1-B may comprise one or more of the diode cells 1-2 for carrying a reverse load current, as explained above. Still speaking in a simplified manner, the anode of freewheeling diode 1-B may be regarded as comprising both the semiconductor anode region 113 and the semiconductor auxiliary region 112, which is preferably only used during the overload state. The cathode of freewheeling diode 1-B may at least partially be composed of the semiconductor region 11.

The gate driver 2, which is operatively coupled to the semiconductor device 1 to be controlled, comprises the gate signal generator 21 and the overload current detector 22. The overload current detector 22 is operatively coupled to the gate signal generator 21 so as to indicate to the gate signal generator 21, whether or not the present load current in the reverse direction exceeds a threshold value. For controlling the semiconductor device 1, the gate signal generator 21 may be electrically connected to the gate electrodes 121 by means of a gate terminal 33.

Further, in terms of a technical current direction, the forward load current (FC) may be fed into the semiconductor device 1 by means of a collector terminal 32 and coupled out of the semiconductor device 1 by means of an emitter terminal 31. Correspondingly, still speaking in terms of a technical current direction, a reverse current (RC or ROLC) is fed into the semiconductor device 1 by means of the emitter terminal 31 and coupled out of the semiconductor device 1 by means of the collector terminal 32. As explained above, the semiconductor device 1 may be configured for conducting the load current in the forward direction (FC) if a voltage between the collector terminal 32 and the emitter terminal 31 of the semiconductor device 1 is greater than 0 V ($V_{CE} > 0$ V). Further, the semiconductor device 1 may be configured for conducting the load current in the reverse direction (RC) if a voltage between the collector terminal 32 and the emitter terminal 31 is smaller than 0 V ($V_{CE} < 0$ V). The emitter terminal 31 may be electrically connected to the semiconductor source regions 114. The collector terminal 32 may be electrically connected to a semiconductor collector region that can, as explained above, be in contact with the semiconductor region 11 and positioned below the semiconductor region 11.

It shall be understood that in case the semiconductor device 1 is a MCD, the collector terminal 32 would rather be referred to as "cathode terminal" and the emitter terminal 31 would rather be referred to as "anode terminal", as has already been explained above. Nevertheless, in the following, the terminals 31 and 32 are referred to as "collector terminal 31" and "emitter terminal 32", only.

In order to detect an overload current, the overload current detector 22 receives the measurement signal 2-2. This measurement signal 2-2 can be produced, e.g., by means of a shunt connected downstream or upstream to the semiconductor device 1. Alternatively or additionally, the measurement signal 2-2 may be provided by a Rogowski coil and/or by any other means suitable for producing the measurement signal 2-2 such that the measurement signal 2-2 is indicative of the amplitude of the present load current conducted by the semiconductor device 1. The means for generating the measurement signal 2-2 may be a part of the overload current detector 22.

Figure 7:
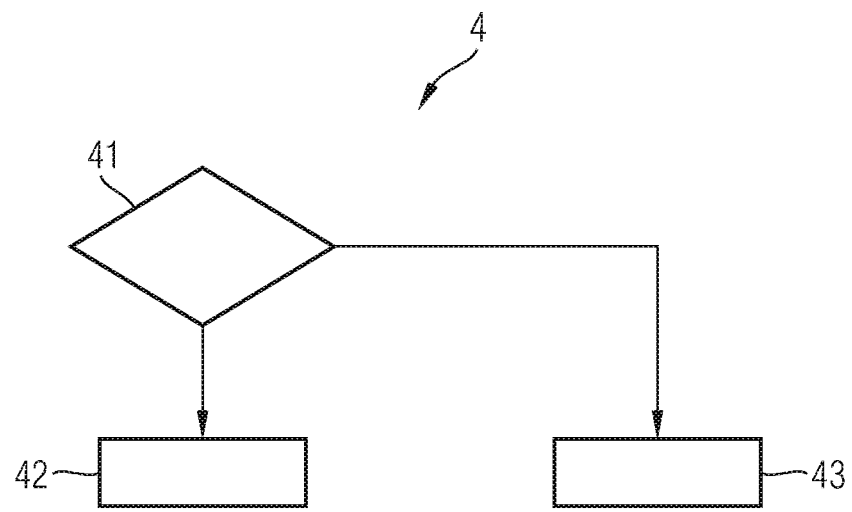
FIG. 7 schematically illustrates a flow diagram of a method of operating a semiconductor device according to one or more embodiments.

Regarding the method 4 schematically illustrated in FIG. 7, it should be noted that this method 4 may be suited for operating a semiconductor device 1 in accordance with the embodiments schematically and exemplary illustrated in FIG. 1 to FIG. 6. For simplicity, it is referred to these exemplary embodiments in the following.

Accordingly, the semiconductor device 1 to be operated (not shown in FIG. 7) may be operable in at least one of a forward current mode and a reverse current mode and may comprise a semiconductor region 11 and a controllable charge carrier injector, wherein the controllable charge carrier injector is configured for injecting charge carriers into the semiconductor region 11. As explained above, if the semiconductor device 1 is a RC-IGBT, the semiconductor device 1 may be operated in both the forward current mode and the reverse current mode. Alternatively, if the semiconductor device 1 is a MCD, the semiconductor device 1 is, e.g., operated in the reverse current mode, only.

The semiconductor device 1 may further comprise a gate electrode 121, the gate electrode 121 being electrically coupled to the controllable charge carrier injector and configured for receiving a gate signal 2-1. In a first step 41, it is detected, in the reverse current mode of the semiconductor device 1, whether or not a load current in the reverse direction conducted by the semiconductor region 11 exceeds a threshold value. If the present load current in the reverse direction does not exceed the threshold value, the semiconductor device 1 is operated (cf. step 42) in a nominal state by providing the gate signal 2-1 with a voltage within a nominal voltage range $R_1$ such that the gate electrode causes the charge carrier injector to induce a first charge carrier density within the semiconductor region 11 so as to allow the semiconductor region 11 to conduct a nominal load current in the reverse direction. If the load current in the reverse direction does exceed the threshold value, the semiconductor device 1 is operated (cf. step 43) in an overload state by providing the gate signal with a voltage within an overload voltage range $R_2$ such that the gate electrode causes the charge carrier injector to induce a second charge carrier density within the semiconductor region so as to allow the semiconductor region 11 to conduct an overload current in the reverse direction, wherein the second charge carrier density is higher than the first charge carrier density.

For example, when being operated in the forward current mode, the forward load current may follow the first load current path within the semiconductor device 1, wherein such first load current path crosses the first pn-junction 11-1, e.g., in a direction substantially perpendicular to a junction area of the first pn-junction 11-1. Further, the first load current path may cross the semiconductor channel region 111, i.e., the semiconductor channel region 111 may be configured for serving as a forward load current carrying element of the semiconductor device 1. To this end, the semiconductor channel region 111 may be electrically connected to an emitter terminal of the semiconductor device 1, such as terminal 31 as illustrated in FIG. 6.

If the semiconductor device 1 is operated in the overload state of the reverse current mode, the reverse overload current may follow the second load current path that crosses the second pn-junction 11-2, e.g., in a direction substantially perpendicular to a junction area of the second pn-junction 11-2. Further, the second load current path may cross the semiconductor auxiliary region 112, i.e., the semiconductor auxiliary region 112 may be configured for serving as a reverse overload current carrying element of the semiconductor device 1. To this end, the semiconductor auxiliary region 112 may be electrically connected to an anode terminal of the semiconductor device 1, such as terminal 31 as illustrated in FIG. 6.

If the semiconductor device 1 is operated in the nominal state of the reverse current mode, the nominal reverse load current may follow a third load current path that crosses the third pn-junction 11-3, e.g., in a direction substantially perpendicular to a junction area of the third pn-junction 11-3. Further, the third load current path may cross the semiconductor anode region 113, i.e., the semiconductor anode 113 may be configured for serving as a reverse load current carrying element of the semiconductor device 1. To this end, the semiconductor anode region 113 may be electrically connected to the anode terminal of the semiconductor device 1, such as terminal 31 as illustrated in FIG. 6.

For example, the gate driver 2 may be operated in accordance with the method 4; in other words, for implementing the method 4, a gate driver 2 can be used.

In the following, reference is made also to FIG. 10, which schematically and exemplary illustrates a circuit diagram of a further circuit arrangement 3 according to one or more embodiments, and to FIG. 9A to 9D, which schematically and exemplary illustrate methods of operating the circuit arrangement 3 of FIG. 10 according to one or more embodiments.

Figure 10:
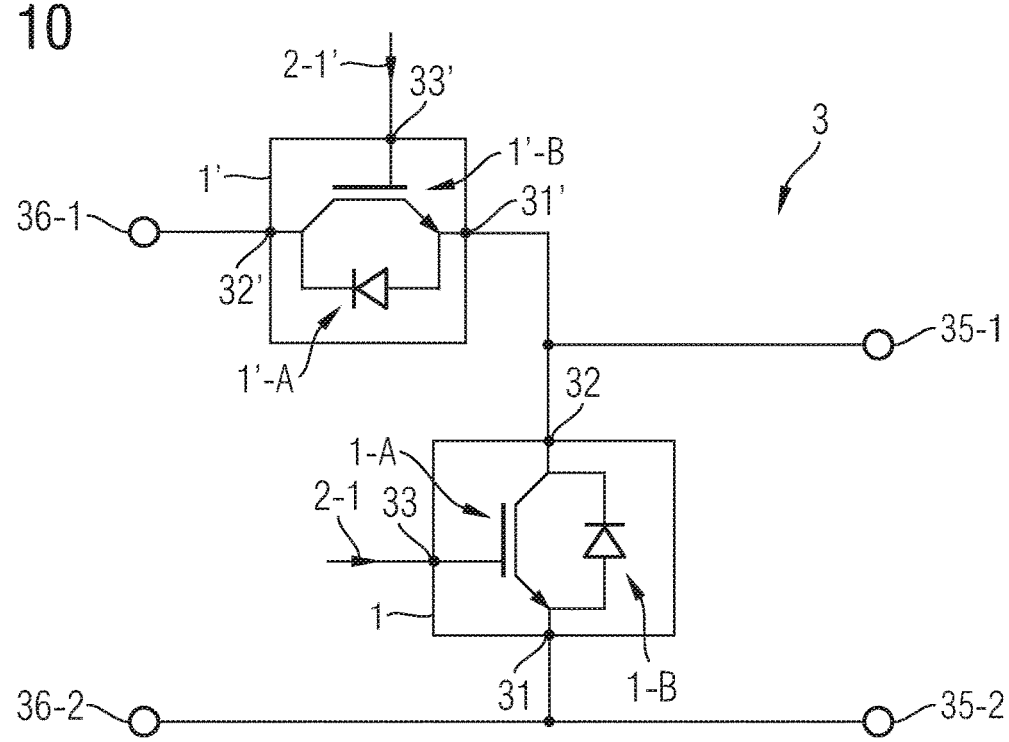
FIG. 10 schematically and exemplary illustrates a circuit diagram of a circuit arrangement according to one or more embodiments.

The circuit arrangement 3 illustrated in FIG. 10 exhibits a similar setup as compared to the power converter 5 illustrated in FIG. 11 that has already been discussed above. The circuit arrangement 3 may also be a power converter or a part thereof and may be used, e.g., for HVDC application, such as for a HVDC application. Accordingly, the circuit arrangement 3 comprises, on the one side, AC terminals 35-1 and 35-2 for receiving and/or outputting an AC voltage and, on the other side, DC-terminals 36-1 and 36-2 for receiving and/or outputting a DC voltage.

The circuit arrangement 3 also includes a semiconductor device 1, e.g., such as discussed with reference to FIG. 6, and a further semiconductor device 1'. The further semiconductor device 1' may exhibit a similar structure as compared to the semiconductor device 1. In accordance with the embodiment schematically illustrated in FIG. 10, the semiconductor device 1 is a RC-IGBT and the further semiconductor device 1' is a further RC-IGBT 1, by way of example.

It should be noted that the further RC-IGBT 1' must not necessarily comprise semiconductor auxiliary regions or, respectively, must not necessarily comprise a controllable charge carrier injector or, respectively, must not necessarily be configured for being operated in an overload state.

Regarding further the circuit configuration of the circuit arrangement 3, the collector terminal 32 of the RC-IGBT 1 may be connected to AC terminal 35-1, and the emitter terminal 31 of the RC-IGBT 1 may be connected to both AC terminal 35-2 and to DC terminal 36-2. Since the RC-IGBT 1 is configured for conducting the reverse overload current (ROLC), an additional thyristor coupled in between the AC terminals 35-1 and 35-2 and connected in parallel to the freewheeling diode 1-B of the RC-IGBT 1 may be omitted. As elaborated above, a ROLC situation may arise, e.g., due to a short circuit between the DC terminals 36-1 and 36-2 (also referred to as "DC Pole-to-Pole Fault") or the like.

The collector terminal 32 of the RC-IGBT 1 is further connected to an emitter terminal 31' of the further RC-IGBT 1'. The further RC-IGBT 1' comprises a transistor 1'-A and a freewheeling diode 1'-B, wherein a collector terminal 32' of the further RC-IGBT 1' is connected to DC terminal 36-1.

With reference to FIG. 9A to 9D, exemplary methods of operating the circuit arrangement 3 shall now be described in more detail.

Generally speaking, the circuit arrangement 3 may be operated by providing the gate signal 2-1 to the gate terminal 33 of the RC-IGBT 1 and by providing a further gate signal 2-1' to the further RC-IGBT 1'. E.g., the gate signal 2-1 may be provided by the gate driver 2 that is schematically illustrated in FIG. 6. The further gate signal 2-1' may be provided by a similar gate driver. In FIG. 10, no gate drivers are illustrated.

Every of FIG. 9A to 9D indicates the voltage V of the gate signals 2-1 and 2-1' over time t. The respective upper graph indicates the course of the voltage of the further gate signal 2-1' provided to the gate terminal 33' of the further RC-IGBT 1', and the respective lower graph indicates the course of the voltage of the gate signal 2-1 provided to gate terminal 33 of RC-IGBT 1.

It should be understood that FIG. 9A to 9D address the situation where the RC-IGBT 1' conducts the load current while being operated in the forward current mode and the RC-IGBT 1 conducts the load current while being operated in the reverse current mode. Certainly, the RC-IGBT 1 may also be operated in the forward current mode and the RC-IGBT 1' may also be operated in the reverse current mode. However, in the following, the latter situation is not regarded in more detail.

Figure 9A:
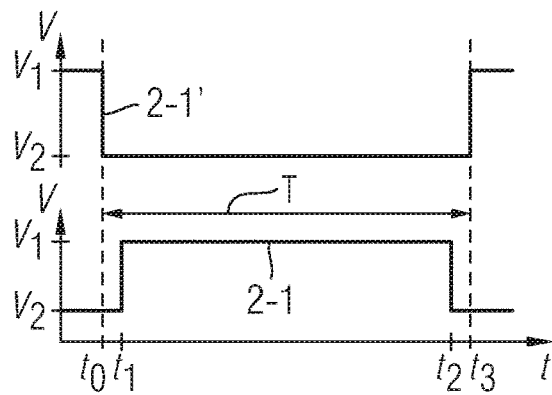
FIG. 9A-D schematically and exemplary illustrate methods of operating a circuit arrangement according to one or more embodiments.
Figure 9B:
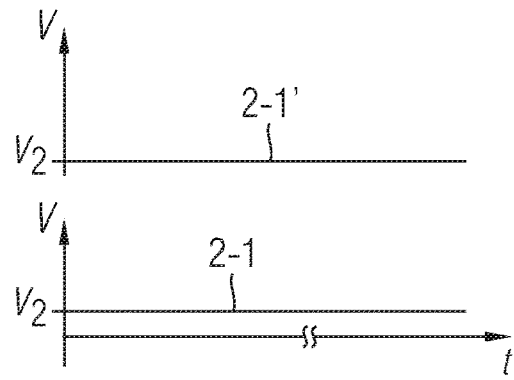
Figure 9C:
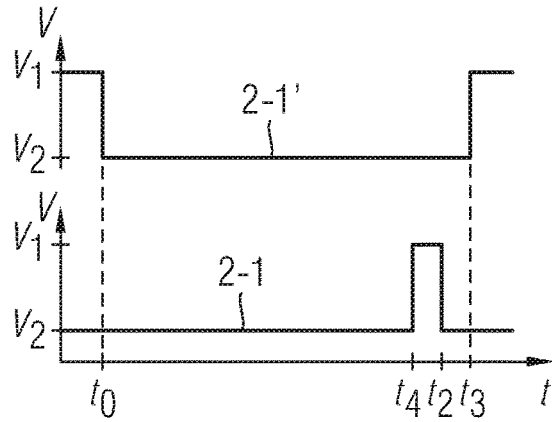

FIG. 9A and FIG. 9C illustrate exemplary operating methods during normal operation of the circuit arrangement 3, i.e., in situations where there is no overload current. During normal operation of the RC-IGBTs 1 and 1' may be operated at a nominal operating frequency that is substantially identical to the reciprocal value of a switching period T that is defined by the difference between $t_3$ and $t_0$. For example, the nominal operating frequency amounts to some hundred Hz.

The transistor 1'-B of the further RC-IGBT 1' can be turned-off at $t=t_0$ by changing the voltage V of the further gate signal 2-1' from $V_1$ to $V_2$. Both $V_1$ to $V_2$ may be included in the nominal voltage range $R_1$ indicated in FIG. 8, wherein $V_1$ can be regarded as a turn-on voltage and $V_2$ as a turn-off voltage. For example, $V_1$ amounts to 15 V and $V_2$ amounts to −15 V. After a short delay of, e.g., some µs, the voltage of the gate signal 2-1 provided to the gate terminal 33 of RC-IGBT 1 may be changed from $V_2$ to $V_1$ at $t=t_1$. Alternatively, as illustrated in FIG. 9C, the voltage of the gate signal 2-1 may be changed from $V_2$ to $V_1$ after a greater delay, e.g., at $t=t_4$. Before turning-on again the transistor 1'-A of the further RC-IGBT 1' at $t=t_3$, the voltage of the gate signal 2-1 may be changed from $V_1$ to $V_2$ at $t=t_2$. The short controlled pulse of the gate signal 2-1 according to FIG. 9C may also be referred to as "desaturation pulse". Such desaturation pulse may reduce losses. The time difference between $t_3$ and $t_2$ may be similar to the time difference between $t_0$ and $t_1$ and may amount to some 100 ns or to some µs; e.g., the time difference between $t_3$ and $t_2$ may be within the range of 500 ns to 3 µs. Thereby, it can be also ensured that the DC terminals 36-1 and 36-2 are not short-circuited by means of simultaneously turned-on transistors 1-A and 1'-A. If the transistor 1'-A of the further RC-IGBT 1' is turned-on, a load current may flow from the collector terminal 32' to the emitter terminal 31' (technical current direction) via the transistor 1'-A. Thus, when being turned-on, the further RC-IGBT 1' may be operated in the forward current mode. If being turned-off, the further RC-IGBT 1' may conduct a reverse current flowing from the emitter terminal 31' to the collector terminal 32' by means of the freewheeling diode 1'-B. In such situation, the further RC-IGBT 1' may be operated in a reverse current mode.

Further aspects of such nominal RC-IGBT operating methods as exemplary illustrated by FIGS. 9A and 9C can be found in D. Werber "6.5 kV RCDC For Increased Power Density in IGBT-Modules", Proceedings of the 26th International Symposium on Power Semiconductor Devices & IC's, June 15-19, Pages 35 to 38, 2014 Waikoloa, Hi., which is hereby incorporated in its entirety by reference. For instance, the operating methods disclosed in the publication, e.g., as explained with respect to FIG. 7c of the publication, may also be applied to circuit arrangement 3 as schematically illustrated in FIG. 10 of the present specification.

For example, if the reverse current conducted by the RC-IGBT 1 does not exceed the threshold value, the RC-IGBT 1 may be operated at the nominal operating frequency by alternating the voltage of the gate signal 2-1 between the turn-on value $V_1$ and the turn-off value $V_2$ at least once within each switching period T.

Figure 9D:
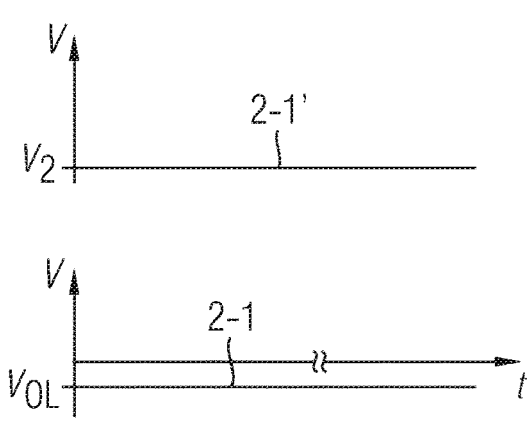

With regards to FIG. 9B and FIG. 9D, an overload current situation shall be now be discussed in more detail. For example, an overload current has to be carried by the circuit arrangement 3 due to a fault on the DC side. In such case, both gate signals 2-1 and 2-1' could be provided with a voltage $V_2$, as indicated in FIG. 9B. This could be sufficient for conducting an overload current, if additionally a further external current path is provided, e.g., by means of a thyristor 54, as explained with respect to FIG. 11. However, as such further external current path is not part of the circuit arrangement 3, the RC-IGBT 1 is set into the overload state by providing the gate signal 2-1 with a voltage $V_{OL}$, as indicated in FIG. 9D. The voltage $V_{OL}$ may be included in the overload voltage range $R_2$ and may amount to, e.g., −40 V. Thus, the voltage $V_{OL}$ may be substantially smaller as compared to $V_2$. This situation is illustrated in FIG. 9D. Providing the voltage $V_{OL}$ activates the semiconductor auxiliary regions 112 included in the RC-IGBT 1, which has already been explained in detail with regards to the preceding drawings.

Further, the RC-IGBT 1 may continuously be operated in the overload state for at least a minimum time period. In an embodiment, the minimum time period is at least as long as the duration of a sinus half wave of an AC grid to which the RC-IGBT 1 may be coupled. Thus, the minimum time period may last for at least, e.g., 1*10 ms, 2*10 ms or 3*10 ms in case of a 50 Hz AC grid. Further, such minimum time period may be equal to or longer than a multiple of the switching period T, such as, e.g., 3*T, 4*T or even longer, such as 10*T or 20*T. For example, the nominal operating frequency is 500 Hz (T=2 ms). In such case, the minimum time period may amount to, e.g., 10 ms.

It should be noted, however, that during nominal operation of the RC-IGBT 1, the voltage of the gate signal 2-1 must not necessarily be continuously within the nominal voltage range $R_1$. Rather, prior to commutation of the load current, the value of the voltage of the gate signal 2-1 may be within the overload voltage range $R_2$ for no longer than a maximum time period Such maximum time period can be equal to or shorter than a fraction of the switching period. E.g., such maximum time period during which the voltage of the gate signal 2-1 may be within the overload voltage range $R_2$ may amount to 10 μs, 5 μs, or 2 μs, by way of example. The reason for such kind of operation may be to avoid that the RC-IGBT 1 shows parasitic behavior during a transition from the reverse current mode into the forward current mode. Such behavior could lead to high losses.

Further, it should be noted that the statements above regarding the voltage ranges $R_1$ and $R_2$ address the situation in which the respective RC-IGBT 1 or 1' is operated in the reverse current mode.

In the above, some drawings showed only parts of a semiconductor device and not a complete semiconductor device. For the purpose of a clear illustration, remaining features of a semiconductor device have not been depicted, since such remaining features are well known to the skilled person. For example, it is known to the skilled person that the semiconductor anode region 113 may be in contact with a diffusion barrier layer disposed on the surface 11-5. It is also known to the skilled person that the semiconductor source region 114 may be in electrical contact with a metallization layer also disposed on the surface 11-5. For example, the surface 11-5 constitutes a frontside of the respective semiconductor device 1, wherein FIG. 1 to FIG. 5 do not schematically illustrate a backside of the respective semiconductor device 1. Further, such backside may include a semiconductor collector region of the respective semiconductor device 1, e.g., if the semiconductor device 1 is a RC-IGBT or, respectively, a cathode region, if the semiconductor device 1 is a MCD. The semiconductor collector region or the cathode region may include one or more n-doped regions and/or one or more p-doped region. Summarizing, each semiconductor device 1 presented above may include a gate terminal that is electrically connected to the gate electrode(s) 121, an emitter terminal that is electrically connected to the semiconductor source region(s) 114, and/or a collector terminal that is electrically connected to a backside metallization of the respective semiconductor device 1. Via the source and collector terminals, the respective semiconductor device 1 may receive and output the load current. Via the gate terminal, the respective semiconductor device 1 may receive the -gate signal 2-1.

Each of the semiconductor devices presented above is, e.g., a power RC-IGBT or, respectively, a power MCD suitable for being employed within a power converter, such as within a power converter for HVDC applications, e.g., within a power converter that exhibits a MMC topology.

For example, the forward load current flows from the backside to the frontside of the respective semiconductor device 1 and the reverse load current flows from the frontside to the backside of, wherein such current direction is schematically indicated within FIG. 1 to FIG. 3, and wherein the current direction can be the so-called technical current direction. In another embodiment, the reverse load current flows from the backside to the frontside of the respective semiconductor device 1 and the forward load current flows from the frontside to the backside.

In an embodiment, the respective semiconductor device 1 is contacted by a frontside contactor and by a backside contactor such that a load current may be coupled into the semiconductor region 11 and out of the semiconductor region 11, e.g., from/to a load current transmission line or cable. The frontside contactor and/or the backside contactor may be configured for conducting an overload current, e.g., an overload current that is many times higher, such as 15 or 20 times higher, than a nominal load current for which the respective semiconductor device 1 is designed. For example, the frontside contactor and/or the backside contactor comprise a number of bond wires, the number of bond wires being configured for conducting the overload current. Further, both the frontside and the backside may exhibit a contacting area sufficiently large for receiving/outputting the overload current.

Summarizing, a semiconductor device in accordance with the embodiments described above, may be operated, when being in the reverse current mode, which is also referred to as "diode mode", in at least one of a nominal state, in which the semiconductor device exhibits commutation robustness, and in an overload state, in which the semiconductor device may carry an overload current in a reverse direction and in which the semiconductor device must not necessarily exhibit commutation robustness.

The embodiments described above include the recognition that, on the one side, connecting a thyristor in parallel to a freewheeling diode of a RC-IGBT may increase the complexity of a power converter. On the other side, it has been recognized that under nominal conditions, in which the RC-IGBT is operated at a nominal switching frequency, it may be required that the RC-IGBT exhibits commutation robustness. To this end, the charge carrier density within the semiconductor region of the RC-IGBT shall not exceed a certain level under nominal conditions. During nominal conditions, the RC-IGBT may be operated at the nominal switching frequency, e.g., at several hundred Hz, and a load current may commutate between the freewheeling diode cell of the RC-IGBT (reverse direction) and a transistor cell of another RC-IGBT (forward direction) at a rate corresponding to the switching frequency. Therefore, the charge carrier density should be limited in order to allow for such high rate load current commutation.

However, since a semiconductor device according to one or more of the aforementioned embodiments comprises the semiconductor auxiliary region or, respectively, the controllable charge carrier injector, the semiconductor device may be operated in the overload state. In the overload state, the controllable charge carrier injector or, respectively, the semiconductor auxiliary region, which may be a part of the controllable charge carrier injector, is used for temporarily increasing the charge carrier density within the semiconductor region so as to allow the semiconductor region to conduct the overload current in the reverse direction. Due to the increased charge carrier density, the semiconductor device exhibits low conduction losses. In the overload state, the semiconductor device may not exhibit commutation robustness anymore due to this increased charge carrier density. However, since the semiconductor device is preferably not switched, i.e., turned-on or turned-off, when being in the overload state, this potential loss of communication robustness does not negatively influence switching capabilities of the semiconductor device. In other words, commutation of the load current is preferably excluded during the overload state. If the semiconductor device is not operated in the overload state, e.g., operated in the forward current mode or in the nominal state of the reverse current mode, the semiconductor auxiliary region is preferably not used, thereby keeping the charge carrier density within the semiconductor region sufficiently low so as to ensure commutation robustness of the semiconductor device.

Features of further embodiments are defined in the dependent claims. The features of further embodiments and the features of the embodiments described above may be combined with each other for forming additional embodiments, as long as the features are not explicitly described as being alternative to each other.

For facilitating understanding of exemplary embodiments schematically illustrated in the drawings, some of the electrodes 121 and 131 have been labelled with a "G", which may be an abbreviation for "Gate", and/or with a "S", which may be an abbreviation for "Source". Thus, the gate electrodes 121 may be electrically connected to a gate terminal of the respective semiconductor device 1 and the first electrodes 131 may be electrically connected to an emitter terminal (also referred to as "anode terminal") of the respective semiconductor device 1.

As explained above, the semiconductor region 11 may mainly be composed of a semiconductor drift region, e.g., a $n^-$-drift region, wherein the pn-junctions 11-1, 11-2 and 11-3 may be formed by a respective transition between the semiconductor channel region 111, the semiconductor auxiliary region 112 and the semiconductor anode region 113 on the one side and the semiconductor drift region on the other side.

Further, as elaborated above, the overload current, e.g., the reverse overload current, may be at least ten times as high as the nominal load current, or even higher, such as twenty times as high as the nominal load current. Accordingly, a load current density within the semiconductor region 11 of the semiconductor device 1 could increase by a corresponding factor, such as by ten, twenty and so on in an overload situation.

Further, within this specification, the term "doping concentration" may refer to an integral doping concentration or, respectively, to a mean doping concentration or to a sheet charge carrier concentration of a specific semiconductor region. Thus, e.g., a statement saying that a specific semiconductor region exhibits a certain doping concentration that is higher or lower as compared to a doping concentration of another semiconductor region may indicate that the respective mean doping concentrations of the semiconductor regions differ from each other.

For example, the second doping concentration being present in the semiconductor auxiliary region 112 can be a mean doping concentration with respect to the entire volume of the semiconductor auxiliary region 112. Further, the first doping concentration being present in the semiconductor channel region 111 can be a mean doping concentration with respect to the entire volume of the semiconductor channel region 111.

In an embodiment, the second doping concentration being present in proximity to the second pn-junction 11-2, for example in an area of the semiconductor auxiliary region 112 at a distance between 10 nm to 100 nm, such as at a distance between 20 nm to 50 nm from the second pn-junction 11-2, is at least 30% higher as compared to the first doping concentration being present in proximity to the first pn-junction 11-1, for example in an area of the semiconductor channel region 111 at a distance between 10 nm to 100 nm, such as at a distance between 20 nm to 50 nm from the first pn-junction 11-1. However, the second doping concentration in the area may even be higher, for example, twice as high, ten times as high, or even yet higher.

In the above, embodiments pertaining to semiconductor devices, embodiments pertaining to circuit arrangements including an semiconductor device and embodiments pertaining to methods of operating a semiconductor devices were explained. For example, these semiconductor devices are based on silicon (Si). Accordingly, a monocrystalline semiconductor region or layer, e.g., the semiconductor regions 11, 111, 112, 113, 114 of exemplary embodiments, is typically a monocrystalline Si-region or Si-layer. In other embodiments, polycrystalline or amorphous silicon may be employed.

It should, however, be understood that the semiconductor regions 11, 111, 112, 113, 114 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC1-x$) and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:
1. A semiconductor device, comprising:
   a semiconductor region, the semiconductor region comprising charge carriers of a first conductivity type;
   a transistor cell included in the semiconductor region and configured to control a current flowing between a main surface and a rear surface of a semiconductor body;

a semiconductor channel region included in the transistor cell, the semiconductor channel region comprising a first doping concentration of charge carriers of a second conductivity type complementary to the first conductivity type, wherein a transition between the semiconductor channel region and the semiconductor region forms a first pn-junction;

a semiconductor auxiliary region included in the semiconductor region and different from the semiconductor channel region, the semiconductor auxiliary region comprising a second doping concentration of charge carriers of the second conductivity type, the second doping concentration being at least 30% higher as compared to the first doping concentration, wherein a transition between the semiconductor auxiliary region and the semiconductor region forms a second pn-junction, the second pn-junction being positioned as deep or deeper in the semiconductor region as compared to the first pn-junction, wherein the semiconductor auxiliary region is positioned closest to the semiconductor channel region as compared to any other semiconductor region of the semiconductor device that comprises charge carriers of the second conductivity type and that forms a further pn-junction with the semiconductor region, and wherein the semiconductor auxiliary region is offset from the semiconductor channel region in a lateral direction that is parallel to the main surface of the semiconductor body, a diode cell included in the semiconductor region, the diode cell comprising a semiconductor anode region, wherein the semiconductor anode region comprises a third doping concentration of charge carriers of the second conductivity type, and wherein the second doping concentration is higher than the third doping concentration, wherein the transistor cell comprises a gate electrode that is configured to control the current between the main and rear surfaces responsive to a gate signal, wherein the gate electrode is disposed in a gate trench that vertically extends from the main surface into the semiconductor body, and wherein the semiconductor auxiliary region directly adjoins a sidewall of the gate trench.

2. The semiconductor device of claim 1, further comprising a semiconductor source region included in the transistor cell and being in contact with the semiconductor channel region, the semiconductor source region comprising charge carriers of the first conductivity type.

3. The semiconductor device of claim 1, wherein a transition between the semiconductor anode region and the semiconductor region forms a third pn-junction, and wherein the second pn-junction is positioned as deep or deeper in the semiconductor region as compared to the third pn-junction.

4. The semiconductor device of claim 1, further comprising at least two first trenches included in the diode cell, each first trench comprising a first electrode and a first dielectric, each first dielectric insulating the first electrode of the respective first trench from the semiconductor body, wherein semiconductor anode region is positioned between two of the first trenches and in contact with the first dielectrics of the two first trenches.

5. The semiconductor device of claim 1, further comprising an auxiliary cell included in the semiconductor region, the auxiliary cell comprising the semiconductor auxiliary region and being positioned adjacent to the transistor cell.

6. The semiconductor device of claim 5, wherein a distance between the auxiliary cell and the transistor cell is lower compared to a distance between the diode cell and the transistor cell.

7. The semiconductor device of claim 1, further comprising at least two second trenches included in the transistor cell, each second trench comprising a gate electrode and a second dielectric, each second dielectric insulating the gate electrode of the respective second trench from the semiconductor region, wherein:

the semiconductor auxiliary region is in contact with the semiconductor channel region and positioned between two of the second trenches; or at least one of the second trenches is positioned between the semiconductor auxiliary region and the semiconductor channel region, both the semiconductor auxiliary region and the semiconductor channel region being in contact with the second dielectric of the at least one second trench; or the semiconductor auxiliary region is positioned as deep or deeper in the semiconductor region as compared to the second trenches and apart from the semiconductor channel region.

8. The semiconductor device of claim 1, wherein the second doping concentration of the semiconductor auxiliary region is at least twice as high as the first doping concentration of the semiconductor channel region.

9. The semiconductor device of claim 1, wherein the semiconductor device is operable in at least one of a forward current mode and a reverse current mode, wherein the semiconductor channel region is configured to conduct at least a part of a nominal load current in a forward direction if the semiconductor device is operated in the forward current mode, and wherein the semiconductor auxiliary region is configured to conduct at least a part of an overload current in a reverse direction if the semiconductor device is operated in the reverse current mode.

10. The semiconductor device of claim 1, wherein the second pn-junction is positioned at a depth at least 50 nm deeper as compared to the depth of the first pn-junction.

11. The semiconductor device of claim 1, further comprising a second trench that is laterally spaced apart from the gate trench, wherein the second trench vertically extends from the main surface into the semiconductor body, wherein a conductive electrode is disposed in the second trench, and wherein the semiconductor auxiliary region extends completely from the gate trench to the second trench.

* * * * *